US011424254B2

(12) United States Patent
Shen et al.

(10) Patent No.: US 11,424,254 B2
(45) Date of Patent: Aug. 23, 2022

(54) SEMICONDUCTOR DEVICE AND MANUFACTURING METHOD OF THE SAME

(71) Applicant: Winbond Electronics Corp., Taichung (TW)

(72) Inventors: Hsin-Huang Shen, Taichung (TW); Yu-Shu Cheng, Taichung (TW); Yao-Ting Tsai, Taichung (TW)

(73) Assignee: WInbond Electronics Corp., Taichung (TW)

( * ) Notice: Subject to any disclaimer, the term of this patent is extended or adjusted under 35 U.S.C. 154(b) by 6 days.

(21) Appl. No.: 16/713,020

(22) Filed: Dec. 13, 2019

(65) Prior Publication Data
US 2021/0183874 A1 Jun. 17, 2021

(51) Int. Cl.
| H01L 29/423 | (2006.01) |
| H01L 29/66 | (2006.01) |
| H01L 27/11521 | (2017.01) |
| H01L 27/11531 | (2017.01) |
| H01L 29/06 | (2006.01) |
| H01L 29/788 | (2006.01) |
| H01L 21/762 | (2006.01) |
| H01L 21/28 | (2006.01) |
| H01L 29/78 | (2006.01) |
| H01L 21/3213 | (2006.01) |

(52) U.S. Cl.
CPC .. *H01L 27/11521* (2013.01); *H01L 21/76224* (2013.01); *H01L 27/11531* (2013.01); *H01L 29/0653* (2013.01); *H01L 29/40114* (2019.08); *H01L 29/42324* (2013.01); *H01L 29/66598* (2013.01); *H01L 29/66825* (2013.01); *H01L 29/7833* (2013.01); *H01L 29/7883* (2013.01); *H01L 21/3213* (2013.01)

(58) Field of Classification Search
None
See application file for complete search history.

(56) References Cited

U.S. PATENT DOCUMENTS

| 6,765,258 | B1 * | 7/2004 | Wu | H01L 27/115 |
| | | | | 257/315 |
| 10,304,680 | B1 * | 5/2019 | Lee | H01L 27/11543 |
| 2005/0136601 | A1 * | 6/2005 | Jang | H01L 21/823481 |
| | | | | 438/296 |
| 2008/0149996 | A1 | 6/2008 | Mokhlesi | |

(Continued)

OTHER PUBLICATIONS

"Office Action of Taiwan Counterpart Application", dated Jun. 29, 2020, pp. 1-5.

*Primary Examiner* — Nelson Garces
*Assistant Examiner* — William H Anderson
(74) *Attorney, Agent, or Firm* — JCIPRNET

(57) ABSTRACT

A semiconductor device and a manufacturing method of the same are provided. The semiconductor device includes a substrate, a plurality of floating gates, a tunneling dielectric layer, a plurality of control gates, and an ONO layer. The floating gates are located on the substrate, and the tunneling dielectric layer is located between the substrate and each of the floating gates. The control gates are located on the floating gates, and the ONO layer is located on two sidewalls of each of the control gates and between each of the control gates and each of the floating gates.

6 Claims, 30 Drawing Sheets (1)

(2)    (3)

(56) References Cited

U.S. PATENT DOCUMENTS

| | | | |
|---|---|---|---|
| 2011/0309426 A1* | 12/2011 | Purayath | H01L 21/764 |
| | | | 257/E21.573 |
| 2014/0339622 A1* | 11/2014 | Murata | H01L 29/40114 |
| | | | 257/316 |
| 2018/0047737 A1* | 2/2018 | Chuang | H01L 29/4975 |
| 2018/0151579 A1* | 5/2018 | Liu | H01L 27/11521 |
| 2020/0176460 A1* | 6/2020 | Decobert | H01L 29/1033 |

* cited by examiner

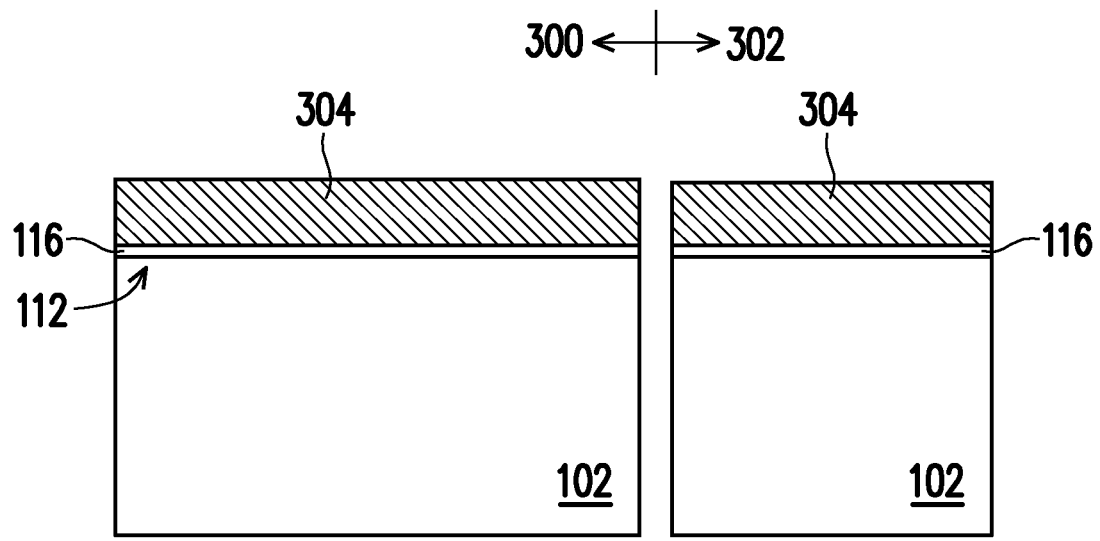
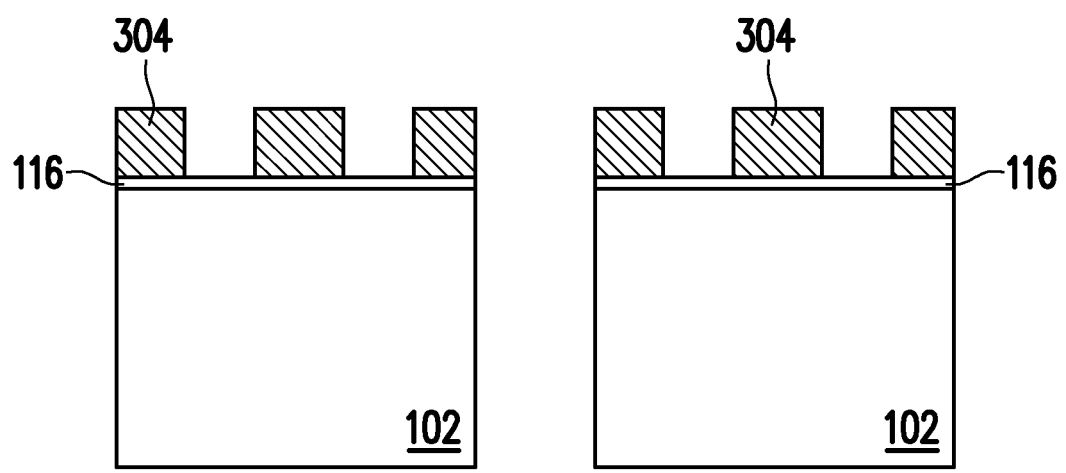
FIG. 3A

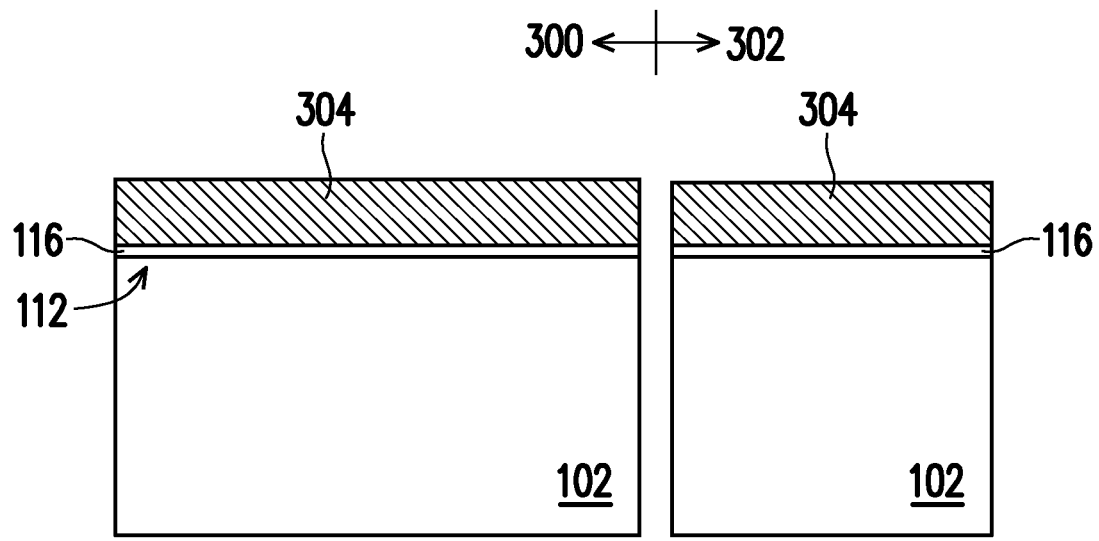
(1)
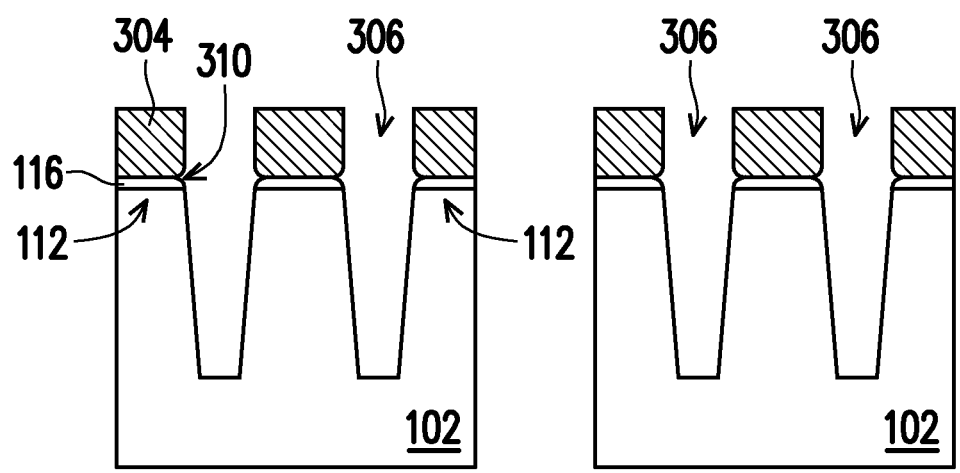
(2)　　　　　　　(3)
FIG. 3B

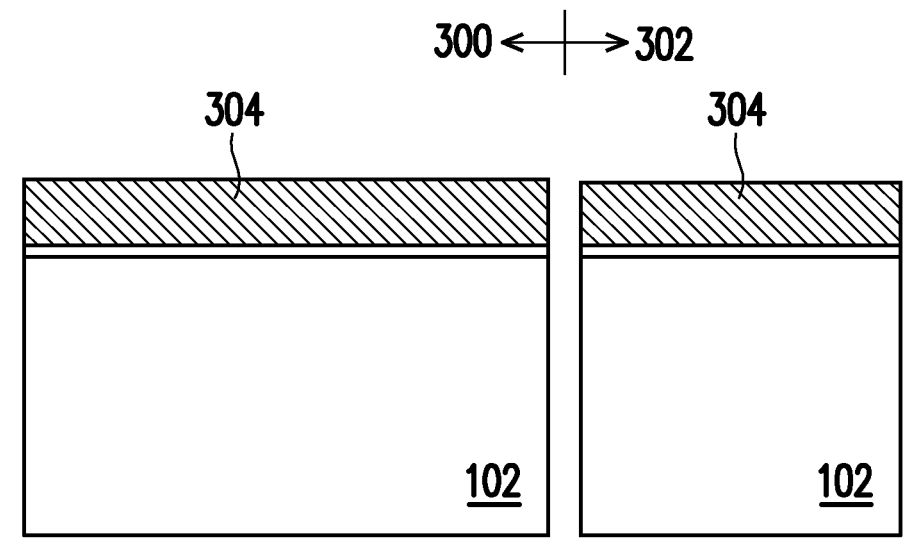
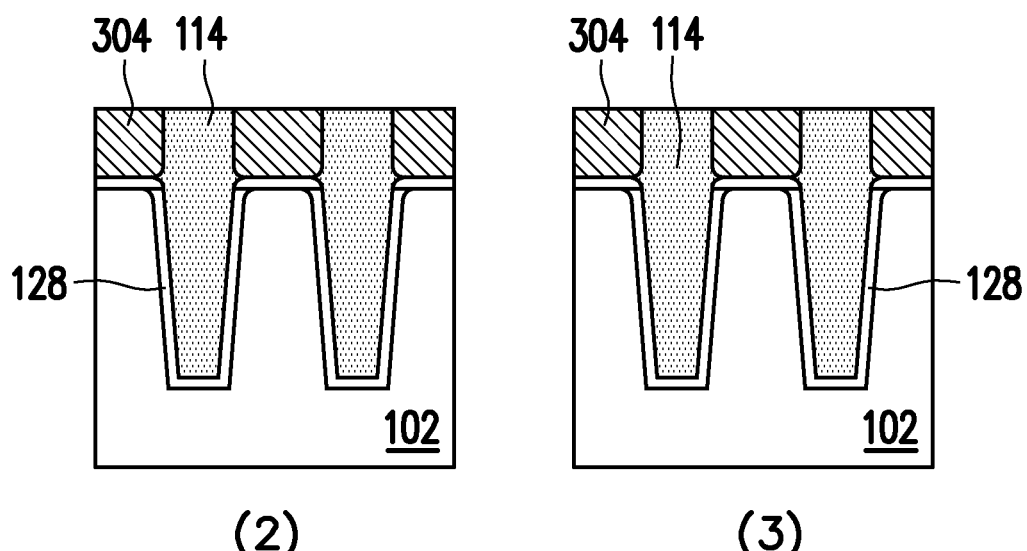
FIG. 3C

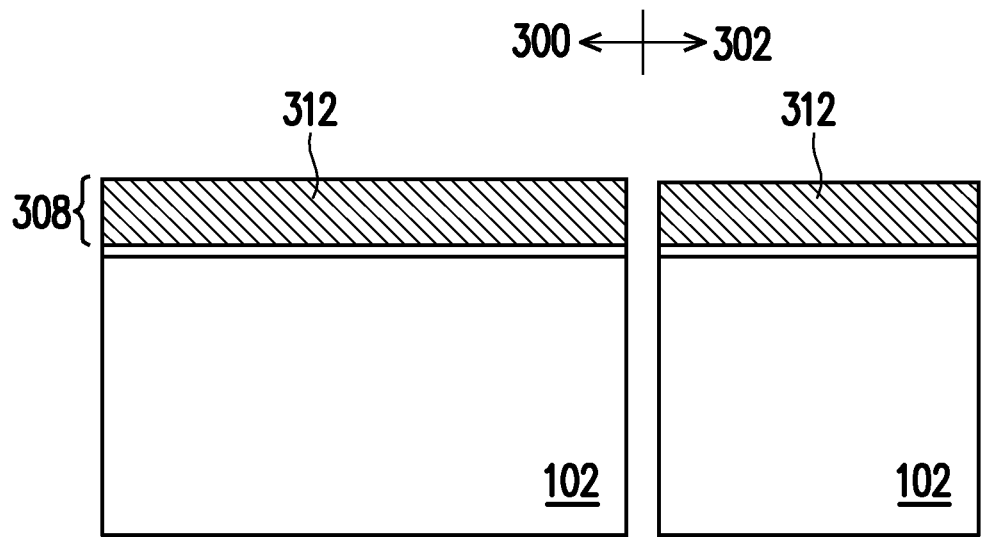
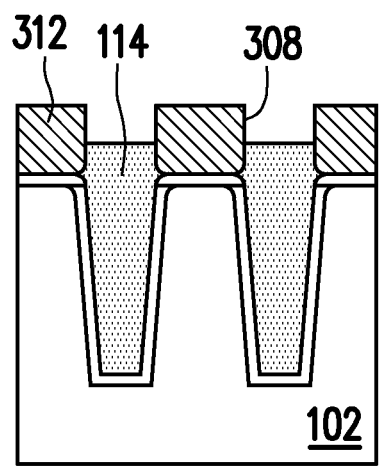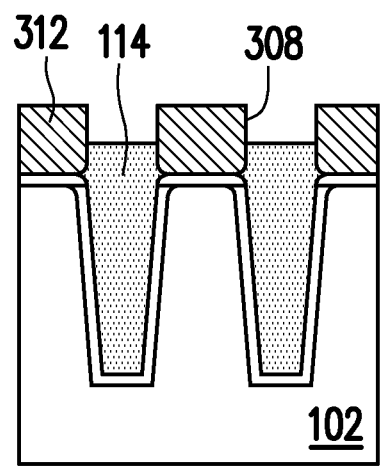
FIG. 3D

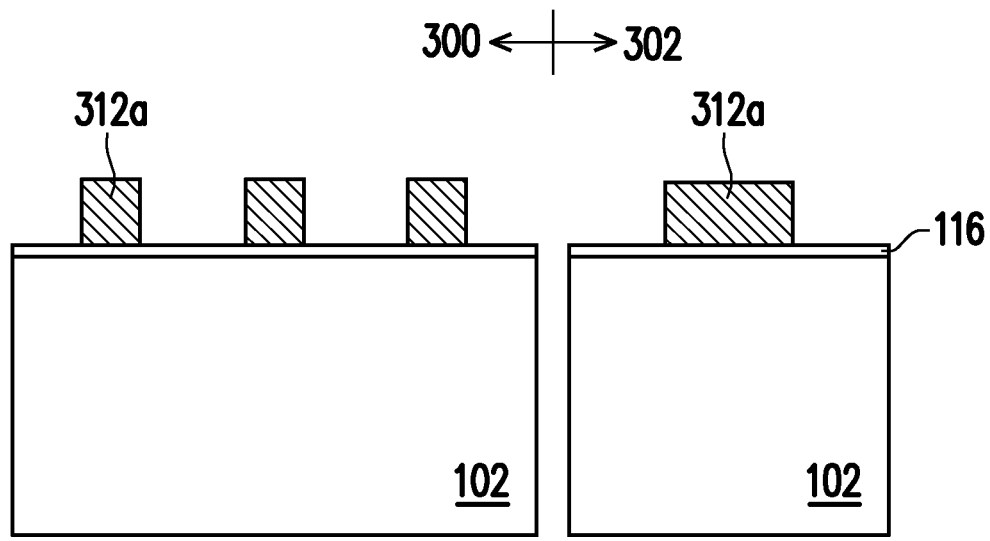
(1)
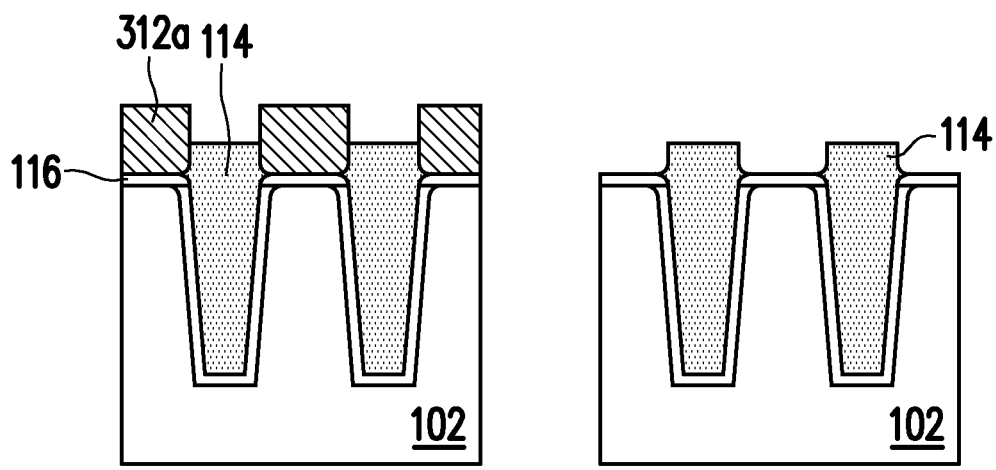
(2) (3)
FIG. 3E

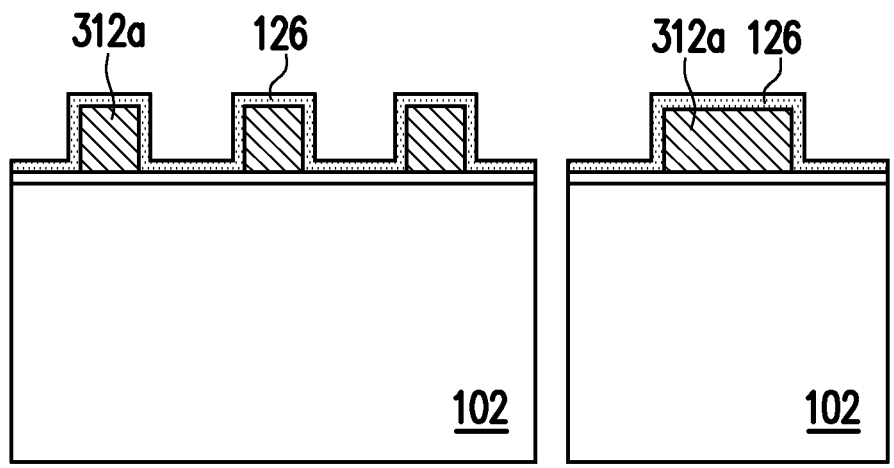
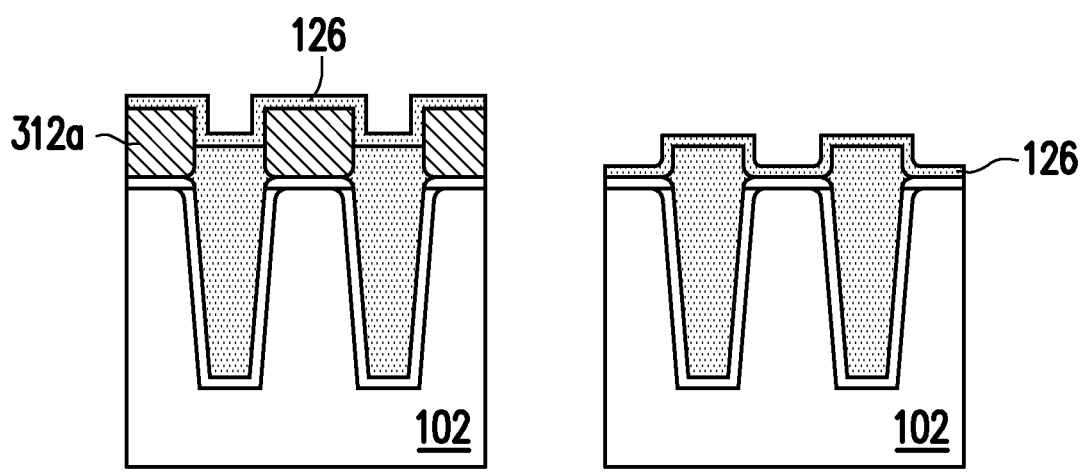
FIG. 3G

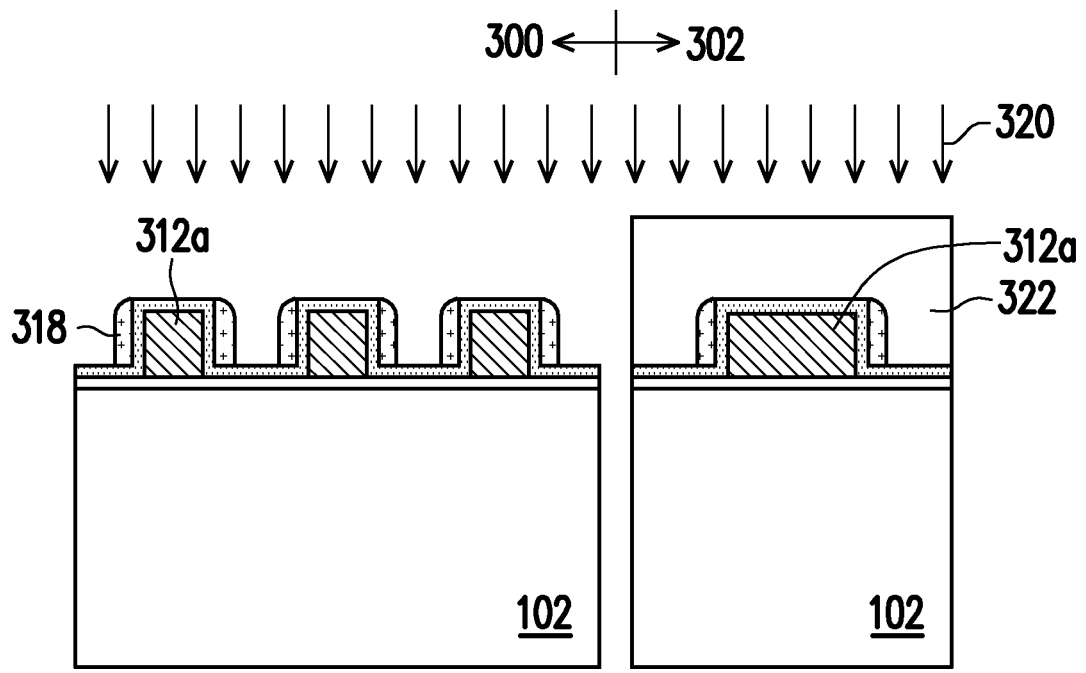
(1)
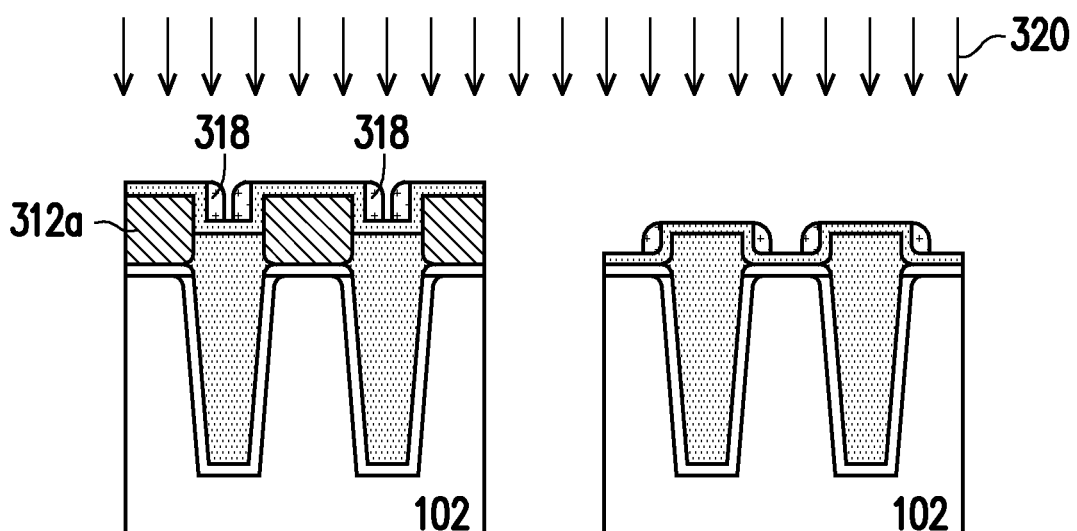
(2)          (3)
FIG. 3H

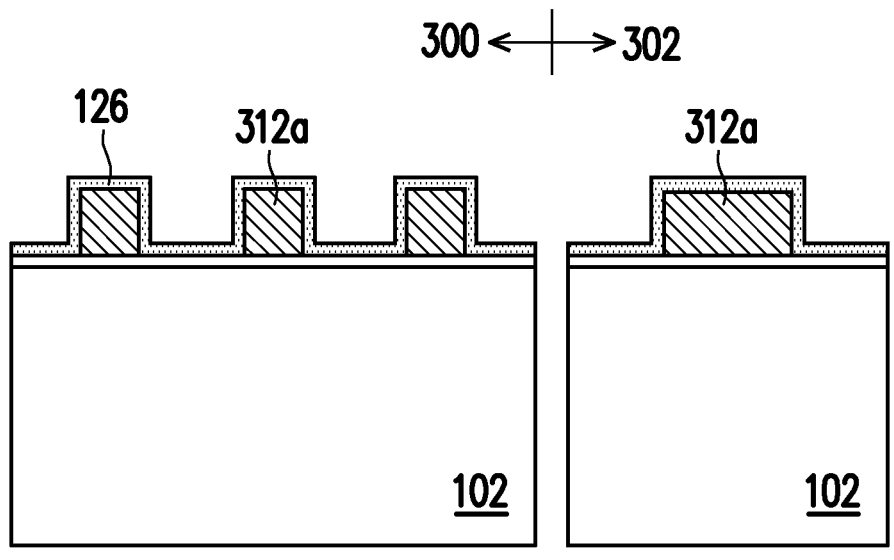
(1)
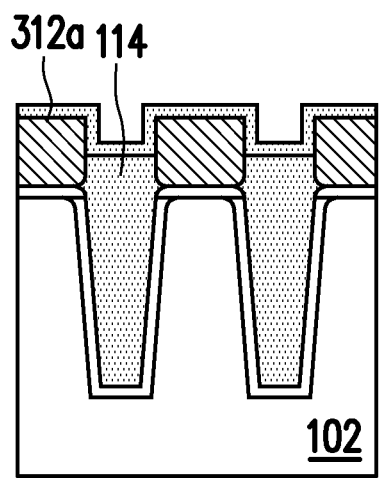
(2)
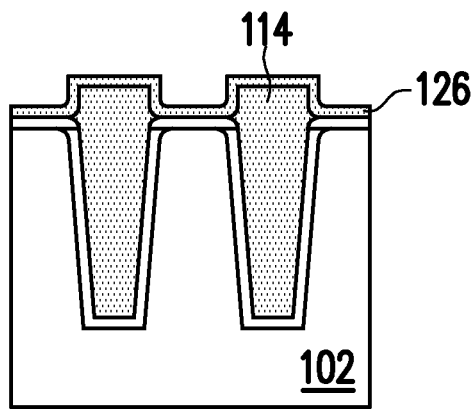
(3)
FIG. 3J

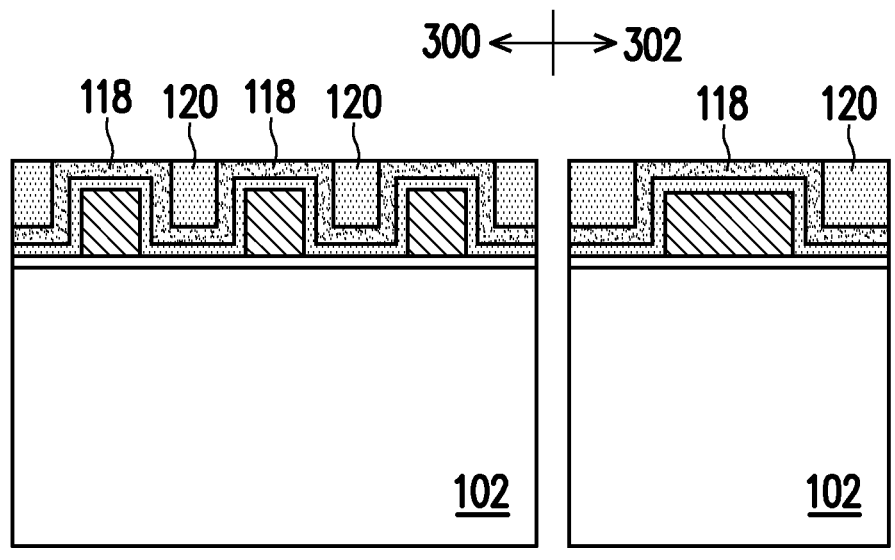
(1)
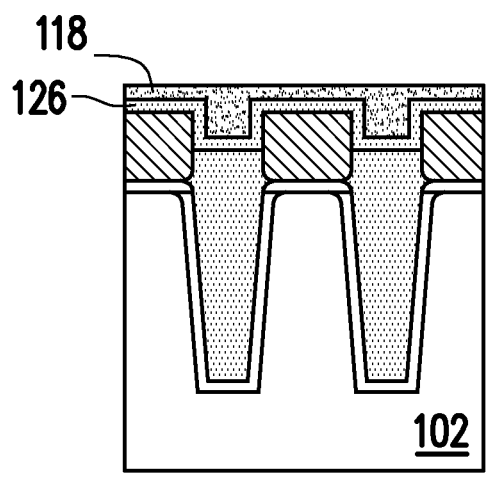
(2)
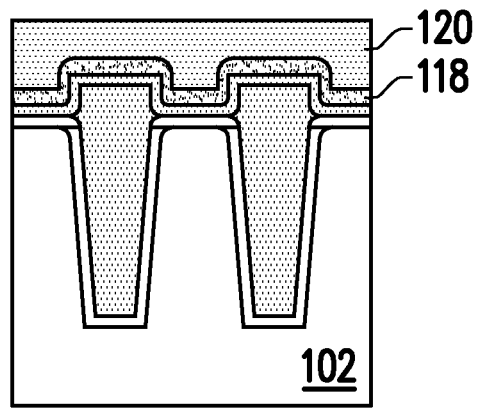
(3)
FIG. 3L

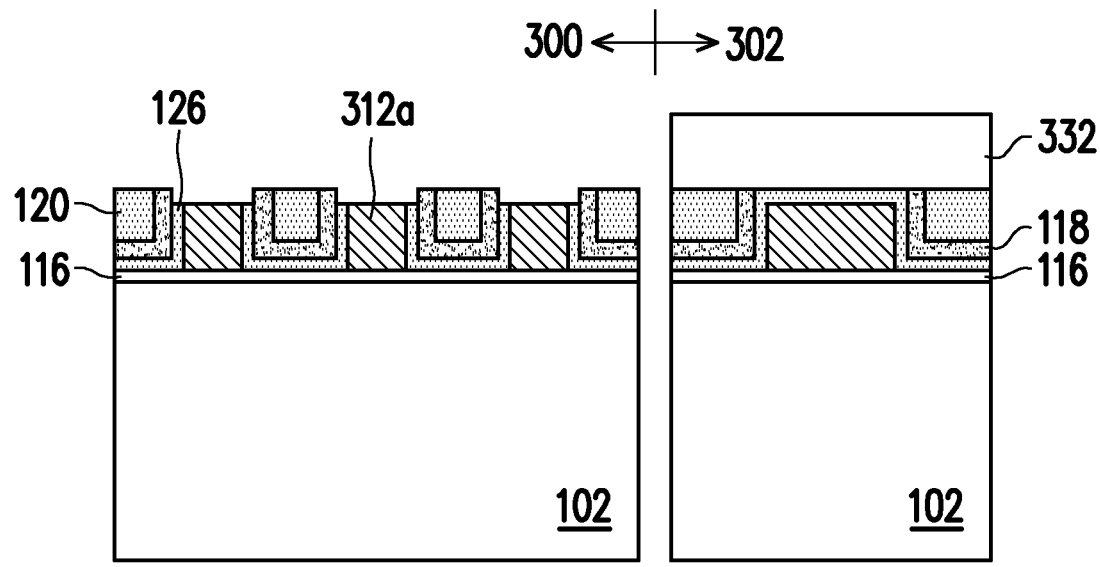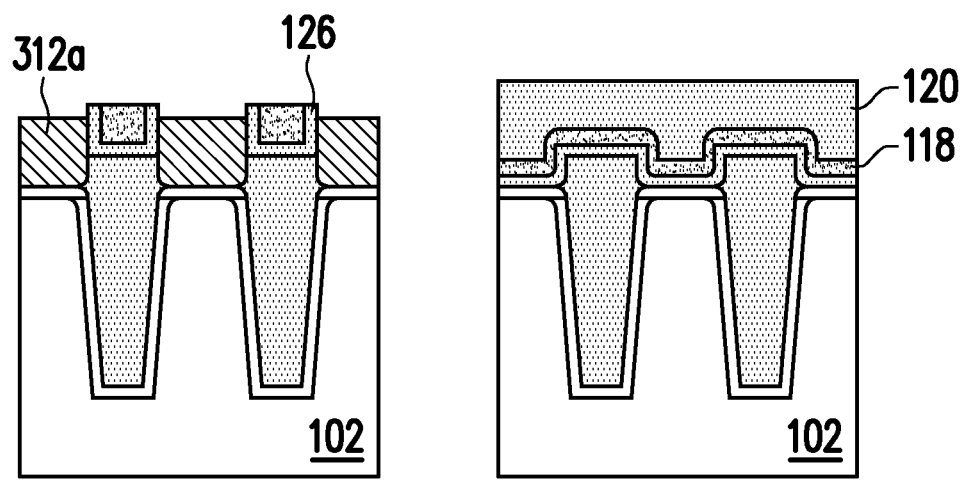
FIG. 3M

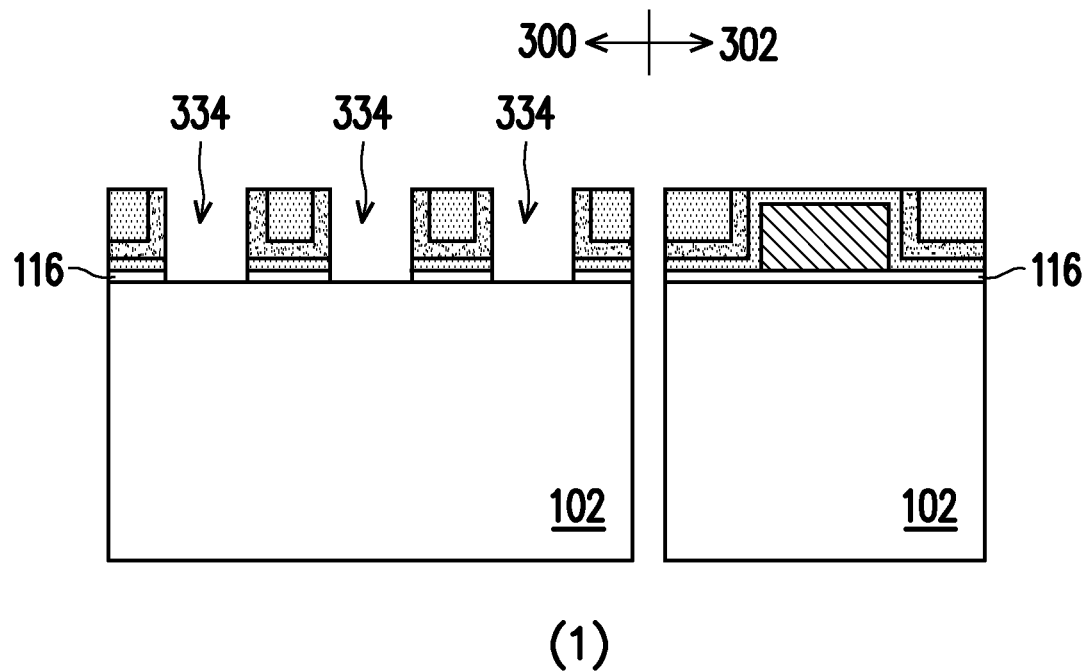
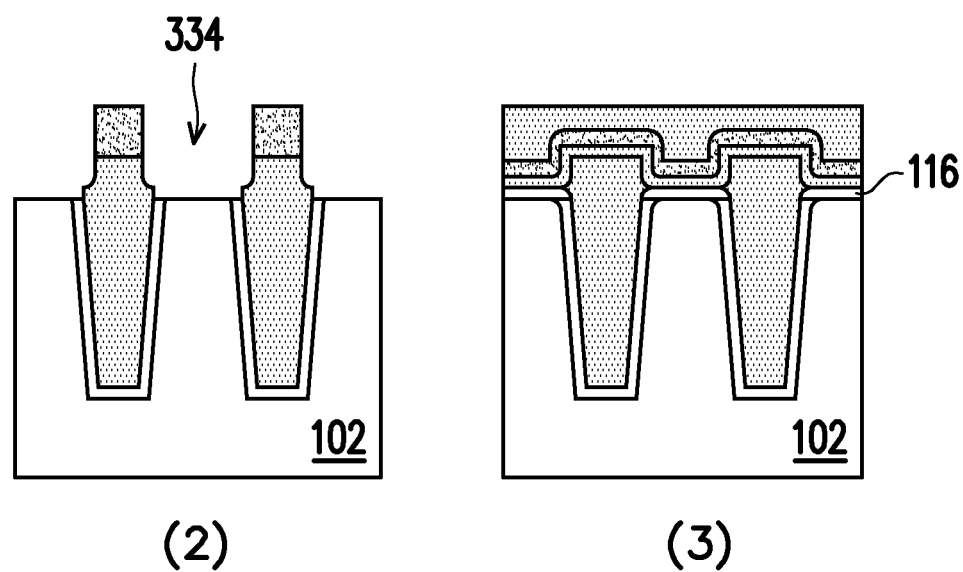
FIG. 3N

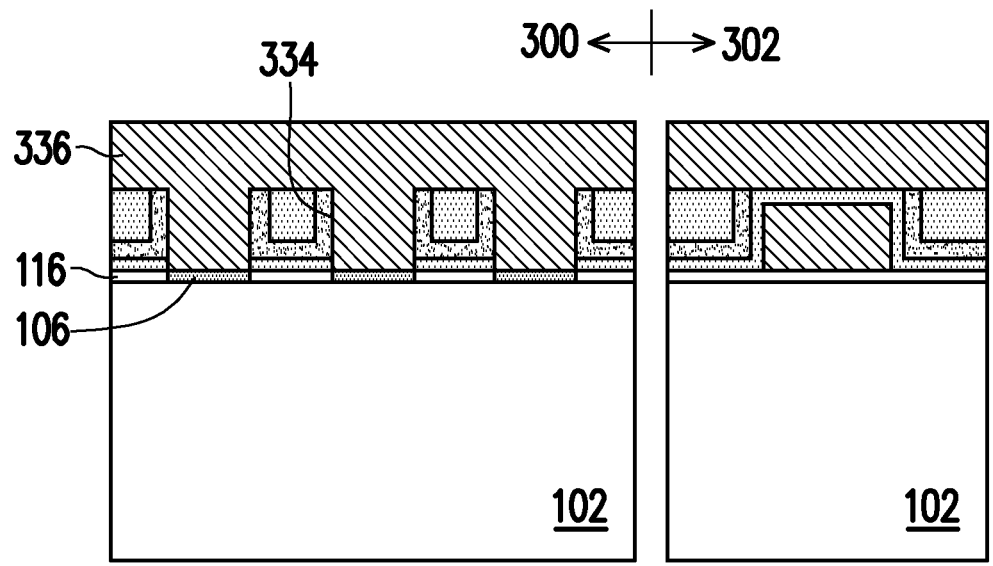
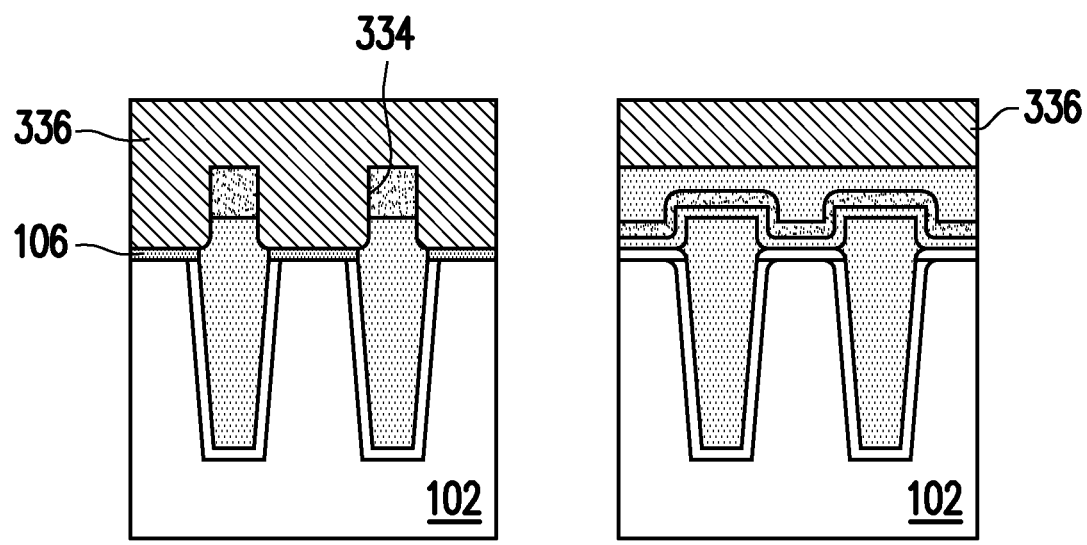
FIG. 30

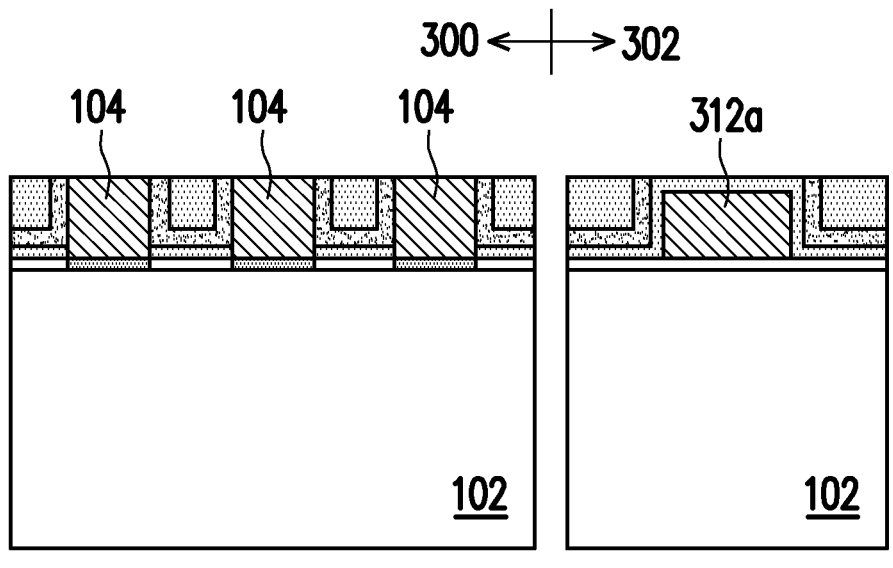
(1)
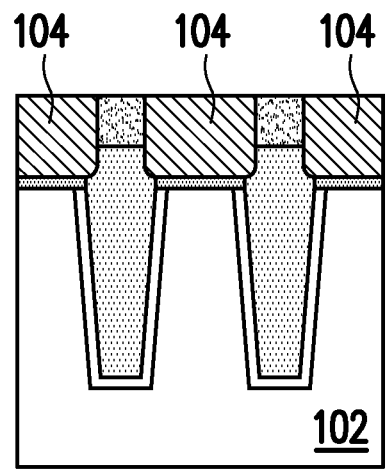
(2)
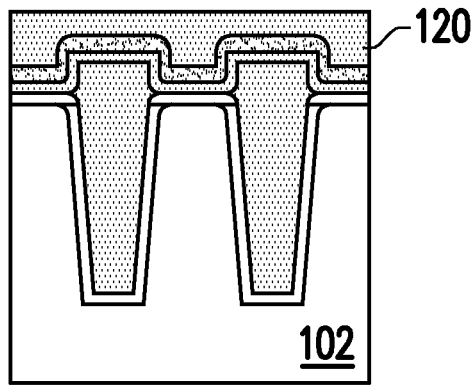
(3)
FIG. 3P

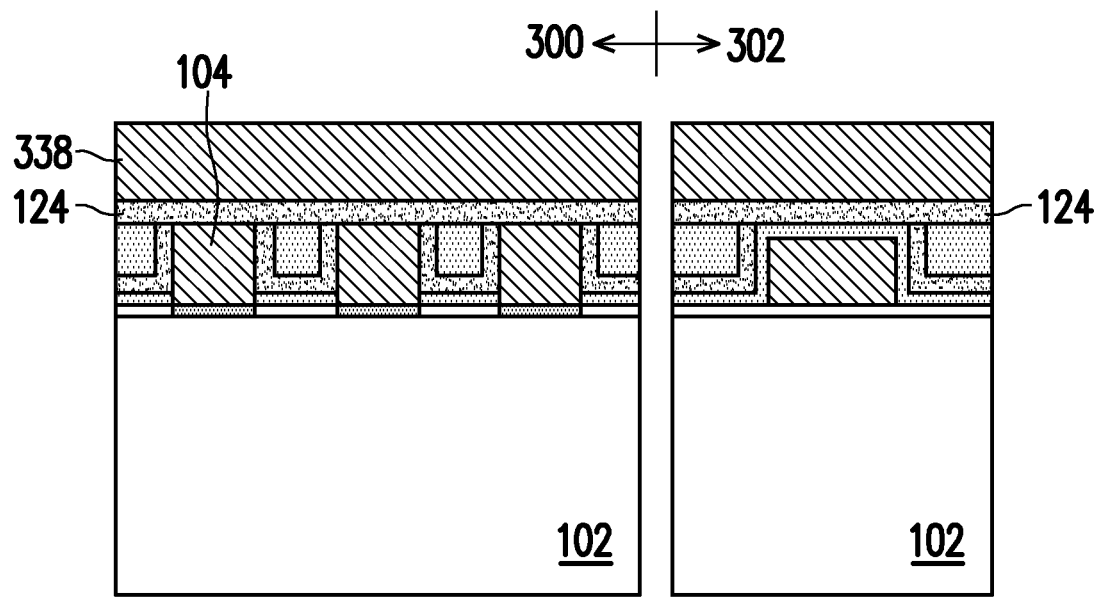
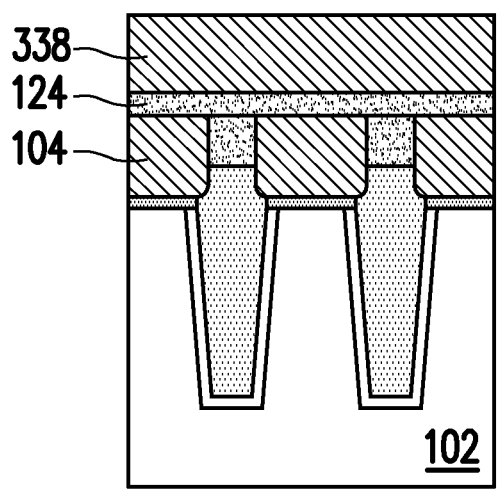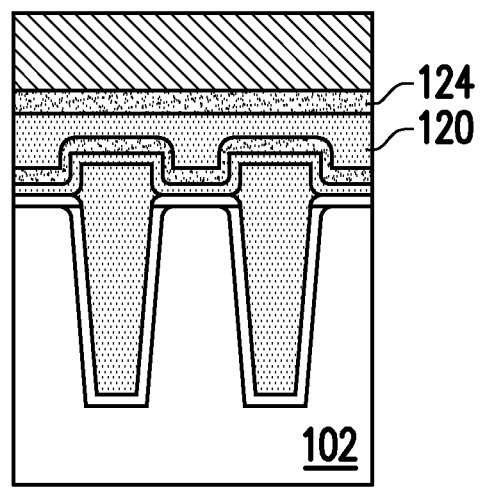
FIG. 3Q

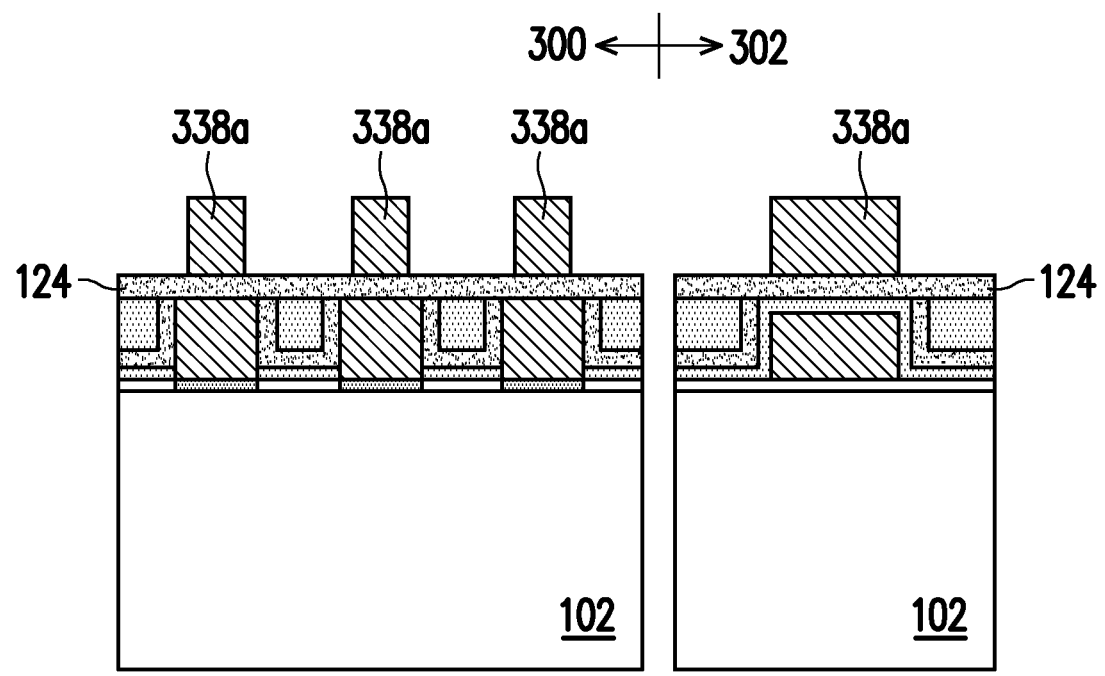
(1)
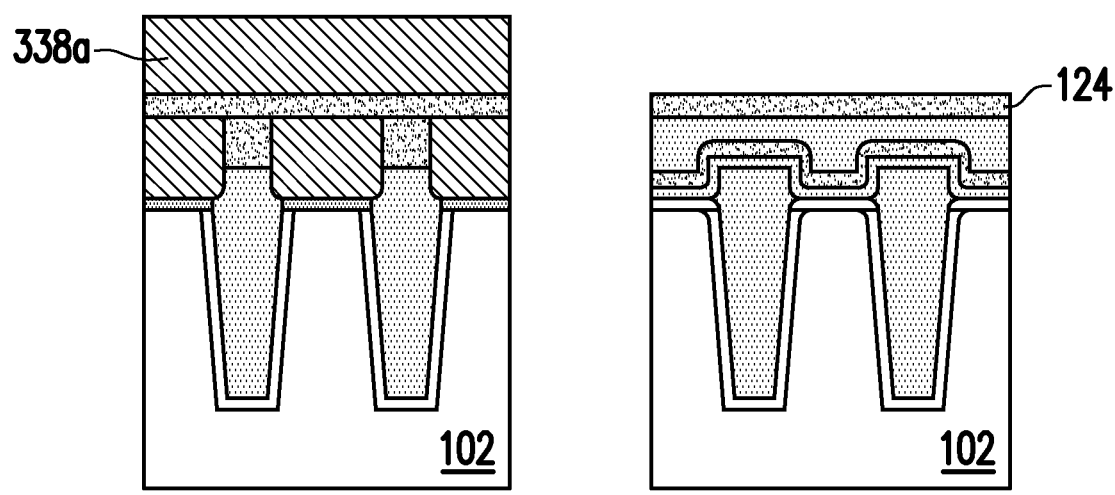
(2) (3)
FIG. 3R

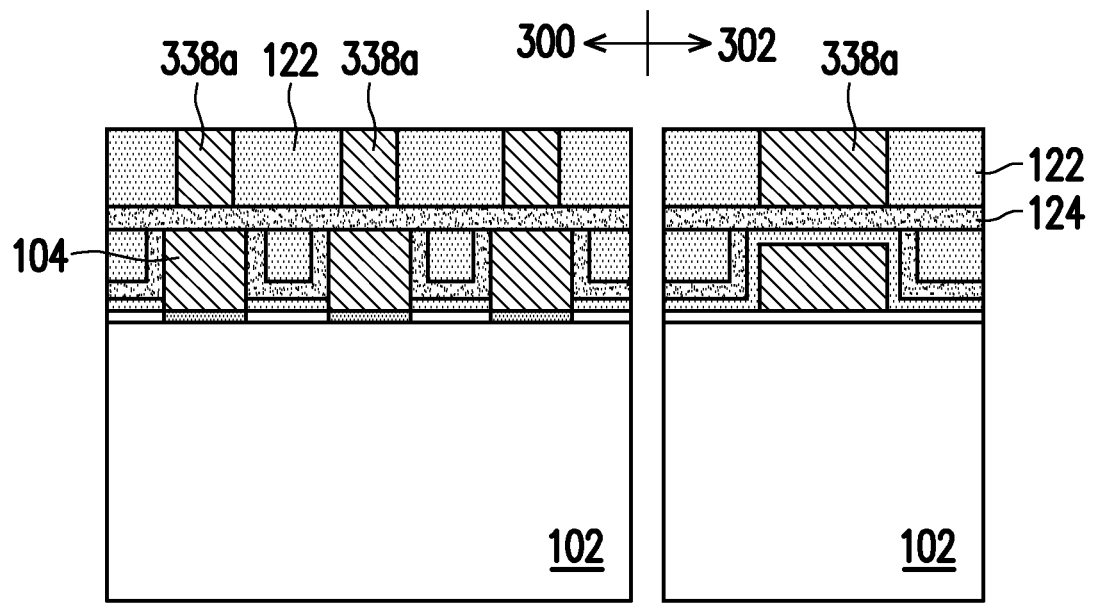
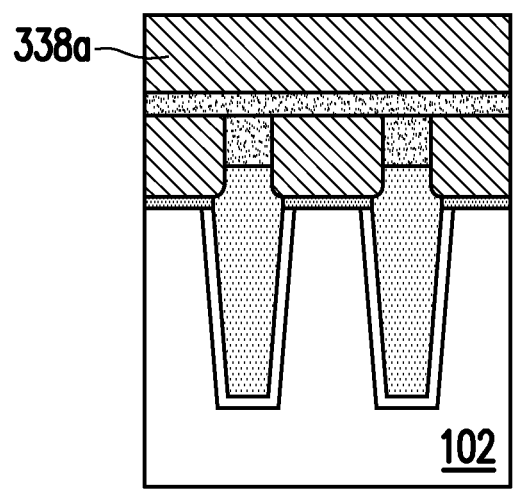 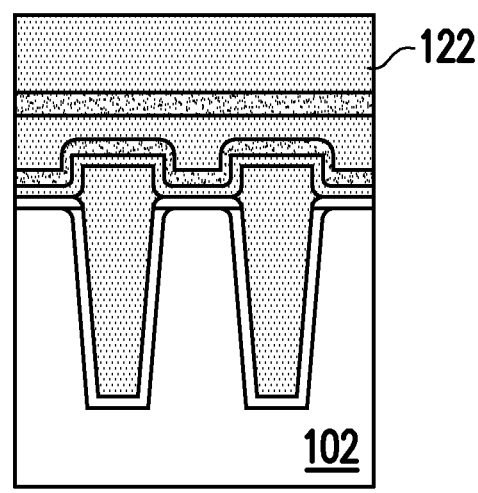
FIG. 3S

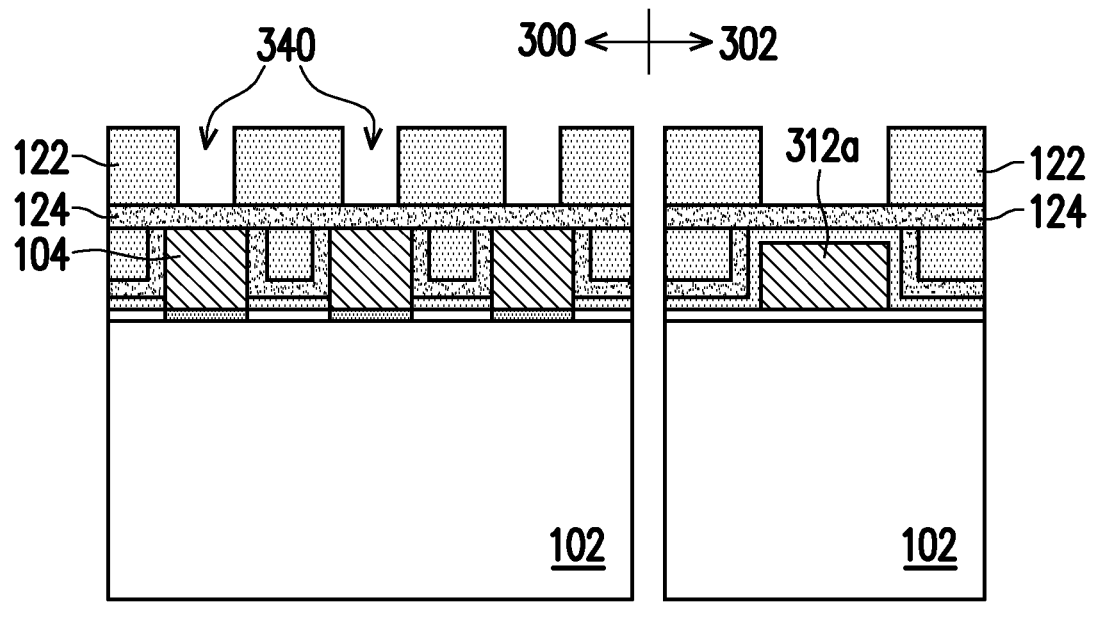
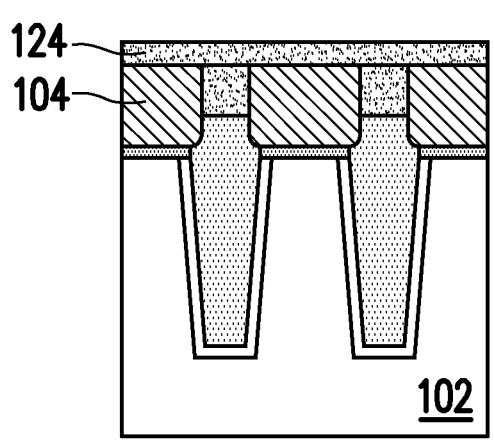 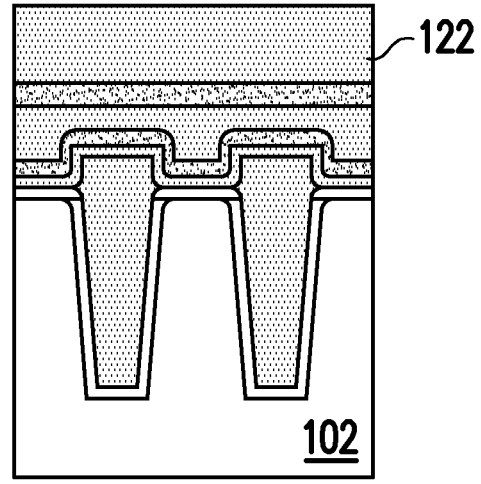
FIG. 3T

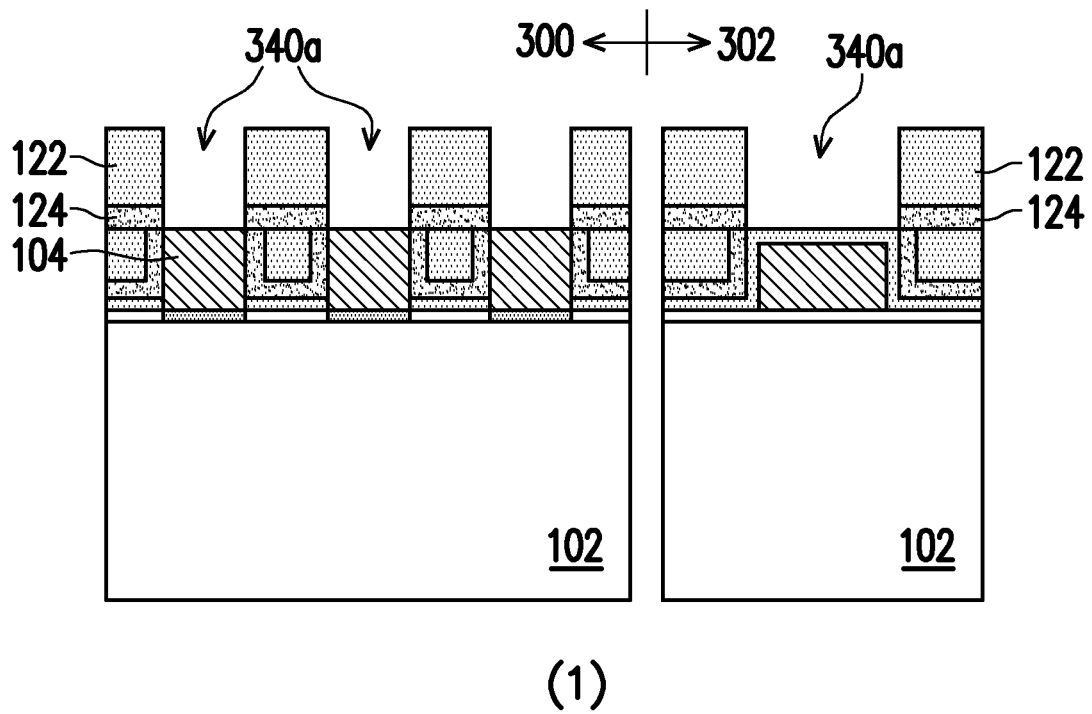
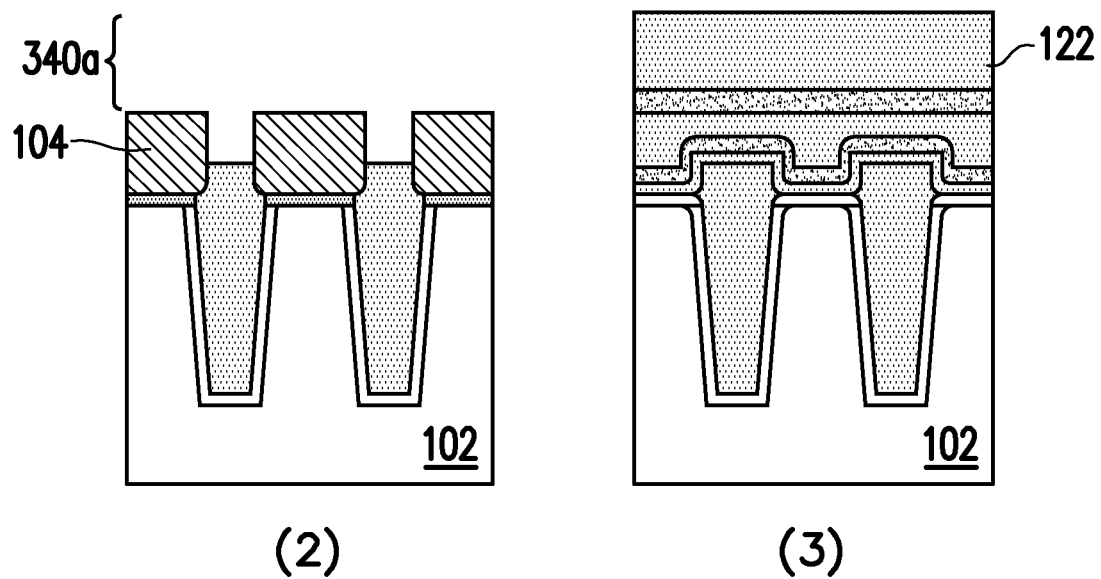
FIG. 3U

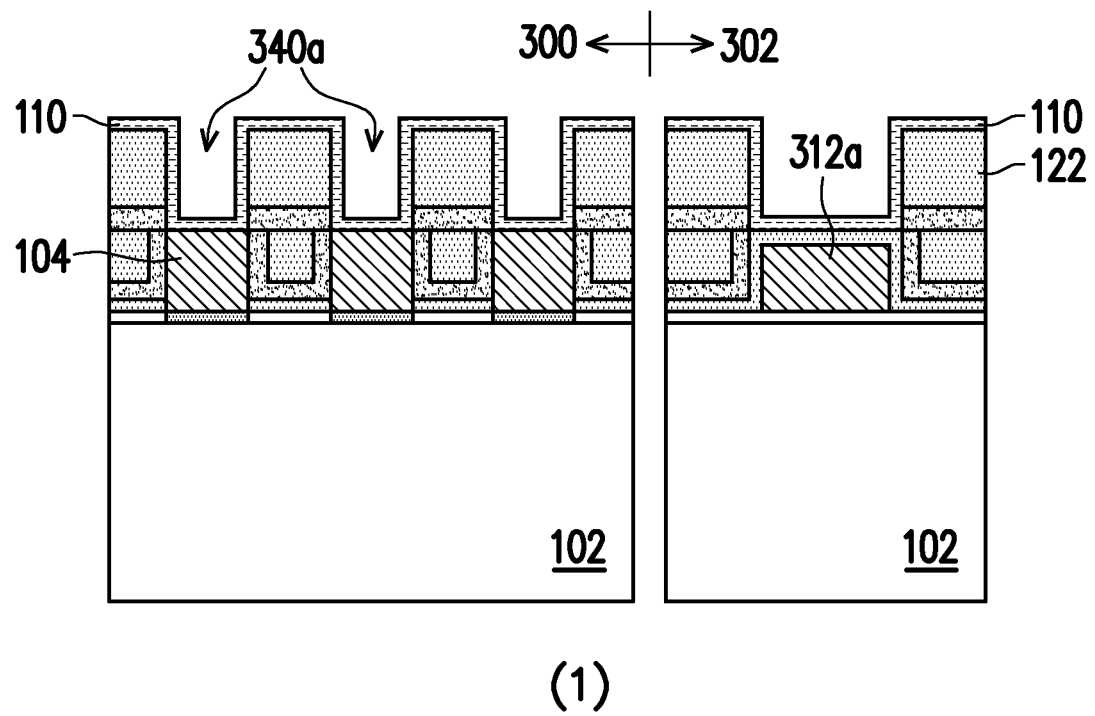
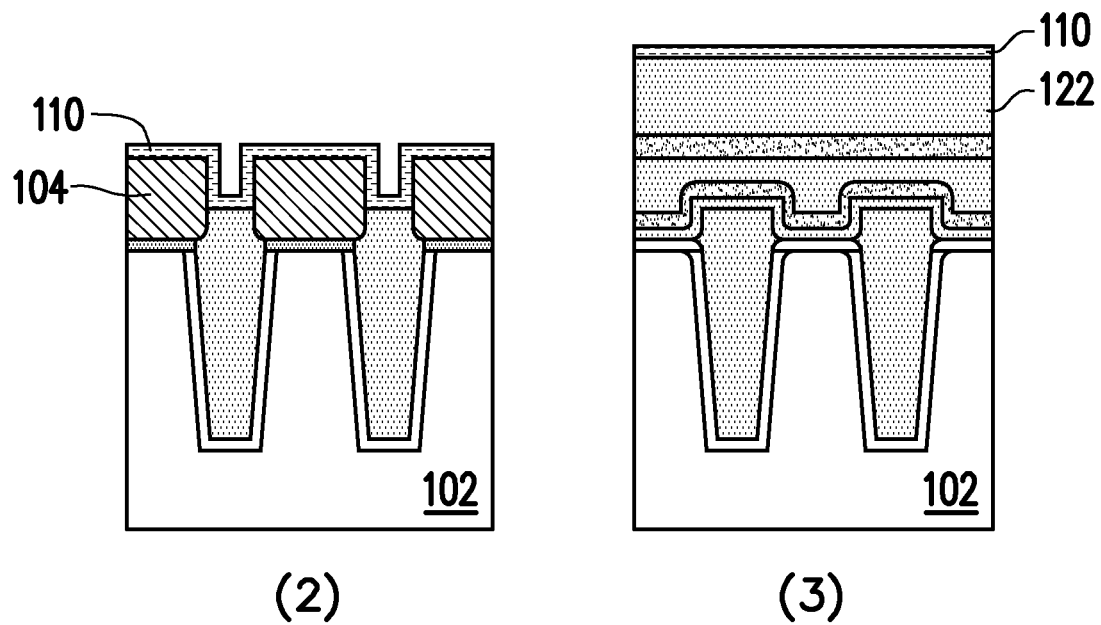
FIG. 3V

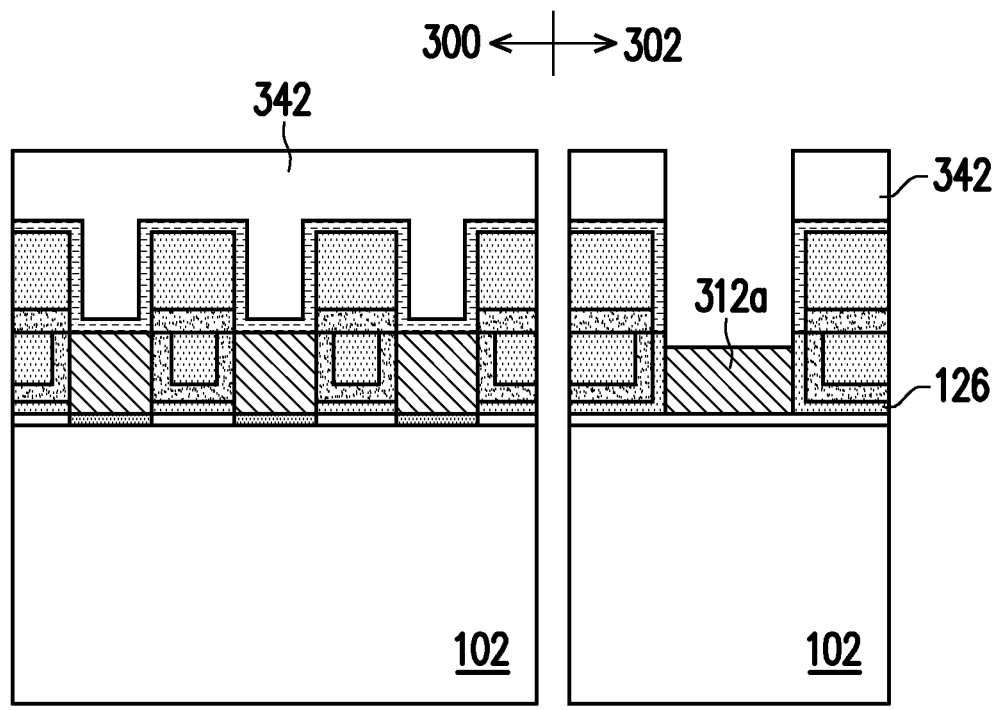
(1)
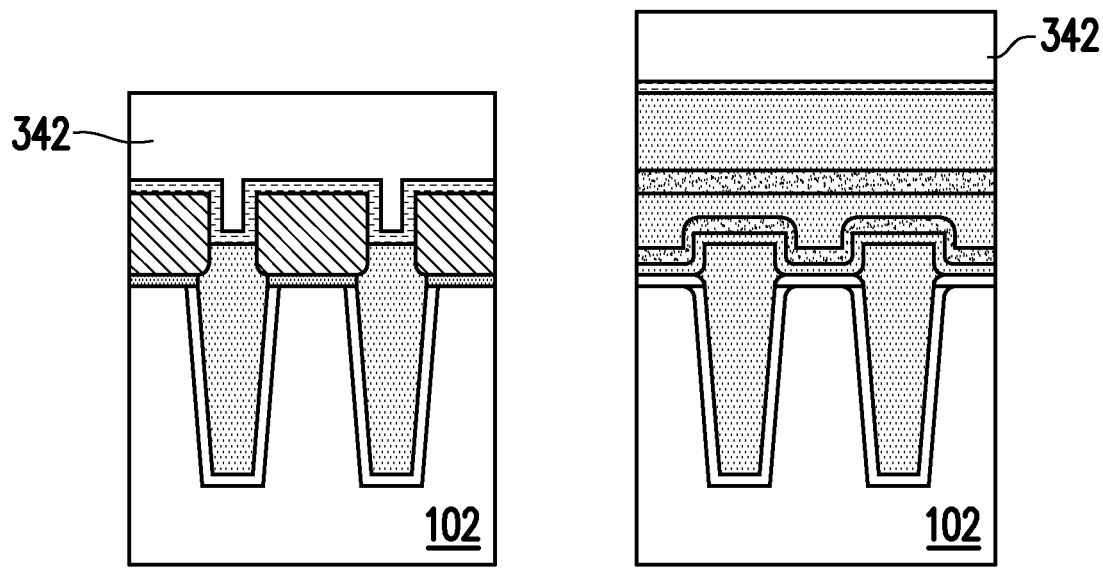
(2) (3)
FIG. 3W

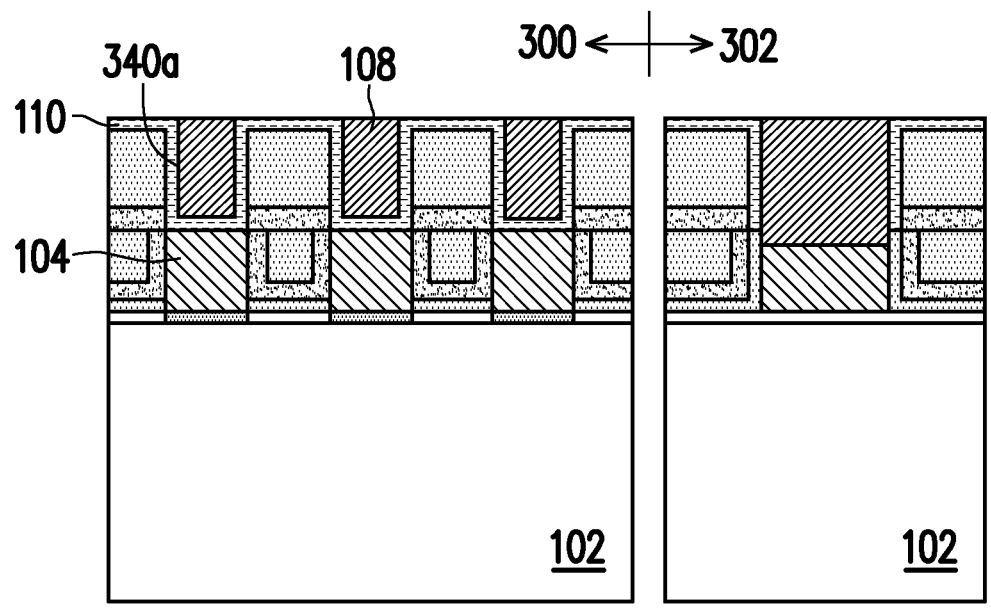
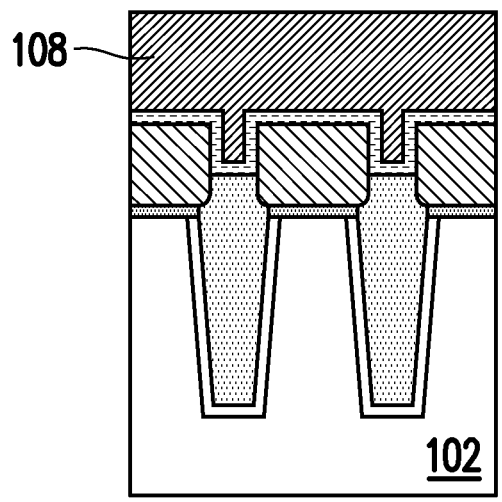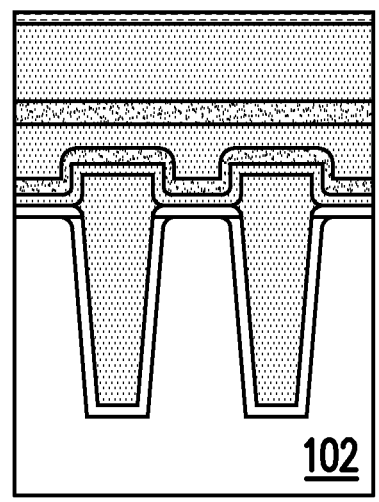
FIG. 3X

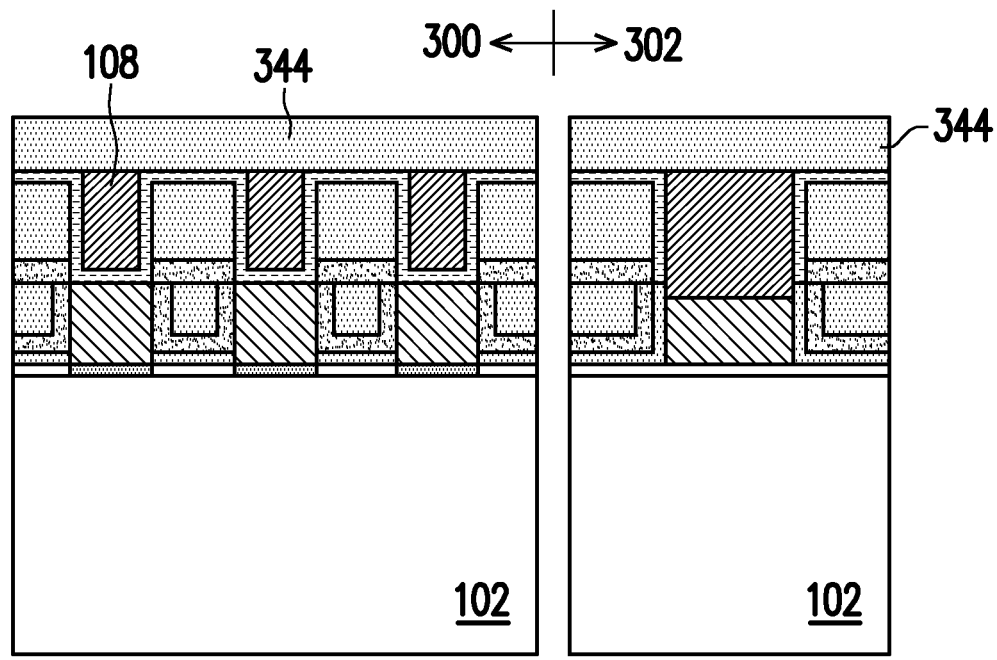
(1)
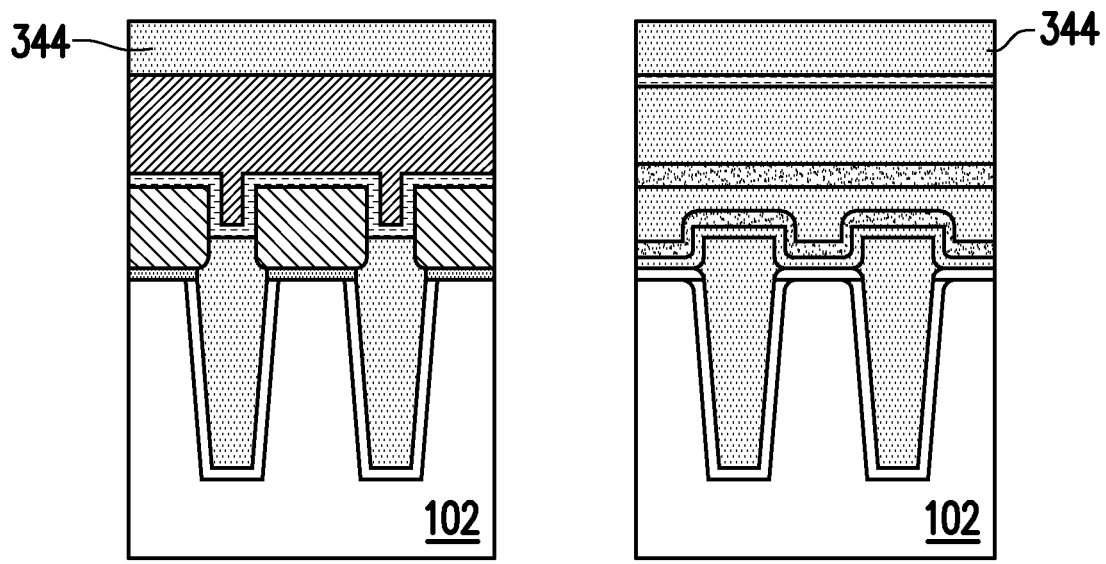
(2) (3)
FIG. 3Y

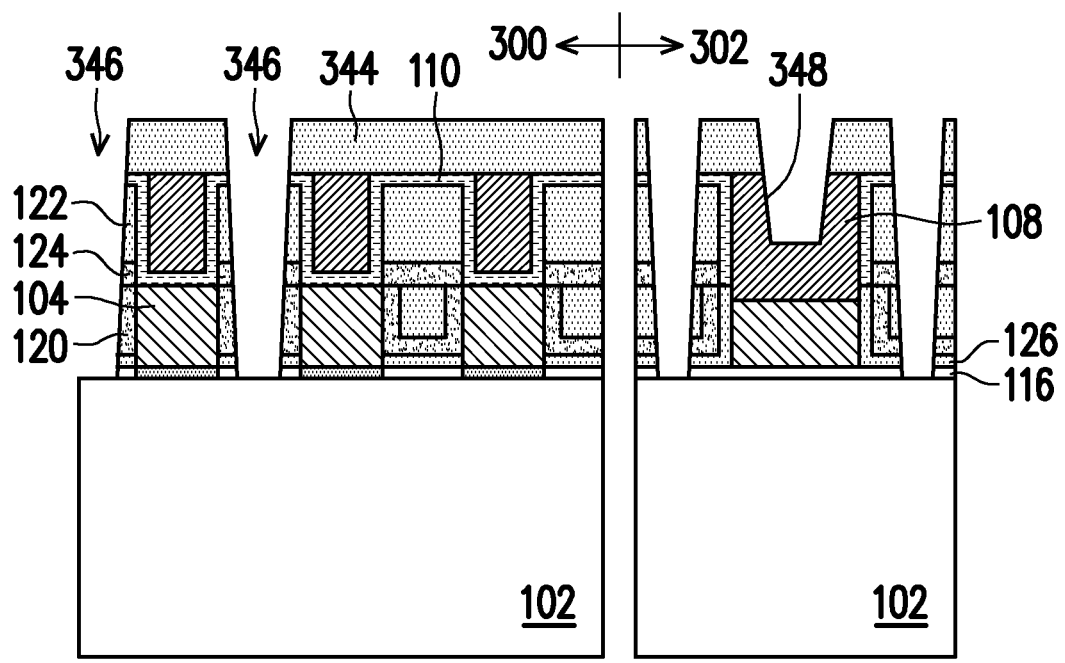
(1)
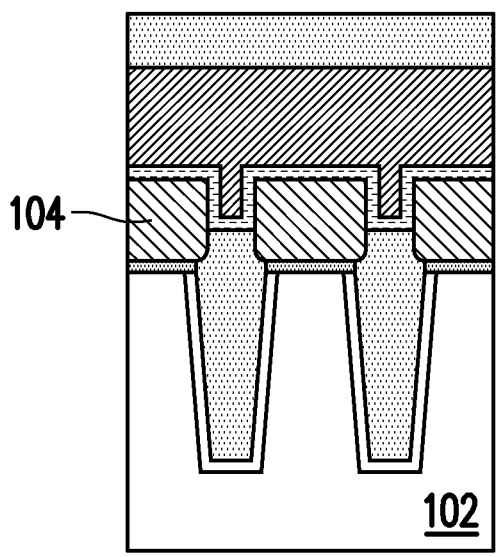
(2)
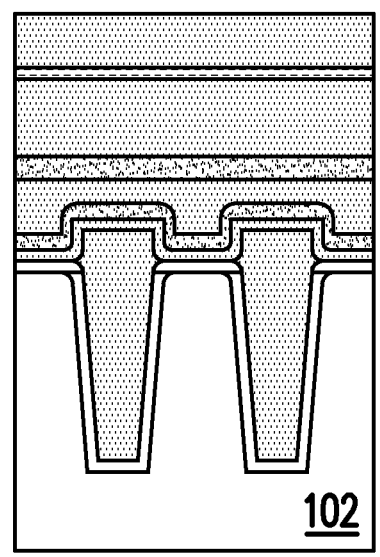
(3)
FIG. 3Z

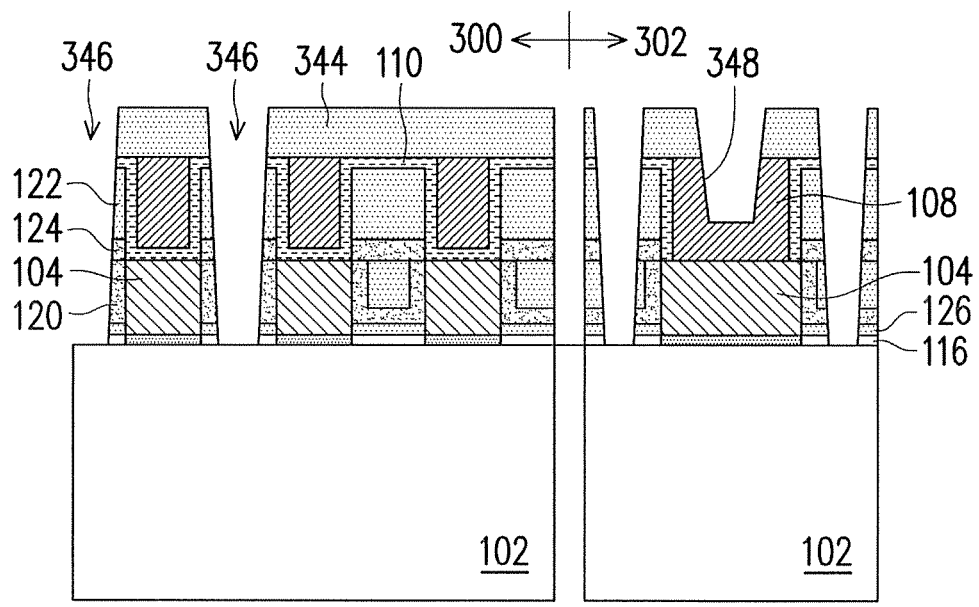
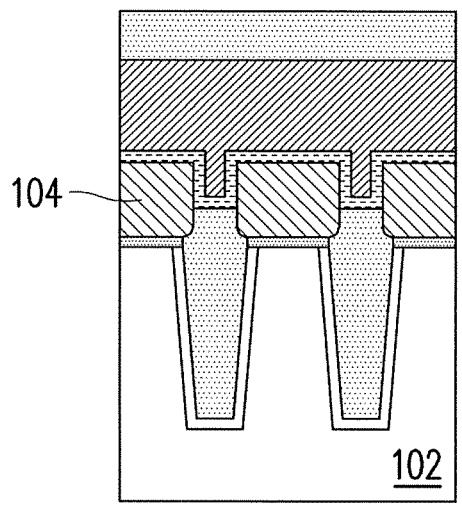 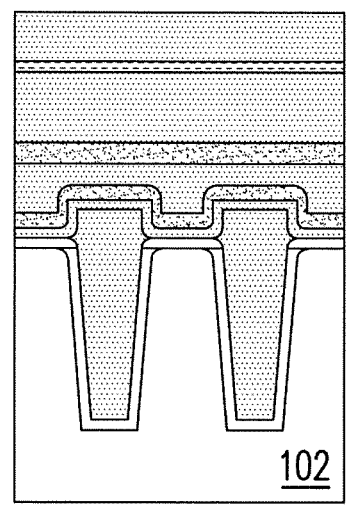
FIG. 4

SEMICONDUCTOR DEVICE AND MANUFACTURING METHOD OF THE SAME

BACKGROUND OF THE INVENTION

Field of the Invention

The invention relates to a semiconductor technique, and in particular, to a semiconductor device capable of improving reliability/endurance of data storage and a manufacturing method of the same.

Description of Related Art

With the miniaturization of the new generation semiconductor processes, the requirements for device reliability and low power consumption are becoming stricter. At present, most advanced processes use high-density plasma reactive-ion etching to define patterns, such as the manufacture of floating gates. However, high-density plasma causes plasma damage and is not conducive to the stored data of the device, thus adversely affecting device reliability.

SUMMARY OF THE INVENTION

The invention provides a semiconductor device having high reliability of data storage.

The invention further provides a manufacturing method of the semiconductor device to improve device reliability.

The semiconductor device of the invention includes a substrate, a plurality of floating gates, a tunneling dielectric layer, a plurality of control gates, and an ONO layer. The floating gates are located on the substrate, and the tunneling dielectric layer is located between the substrate and each of the floating gates. The control gates are located on the floating gates, and the ONO layer is located on two sidewalls of each of the control gates and between each of the control gates and each of the floating gates.

The manufacturing method of the semiconductor device of the invention includes the following steps. A pad oxide layer is deposited on a substrate. A first sacrificial material is formed on the pad oxide layer. A portion of the first sacrificial material is etched and removed to form a plurality of first sacrificial patterns at a portion in which a plurality of floating gates are to be formed. A first inner dielectric layer is deposited on the substrate and the first sacrificial patterns are covered. A portion of the first inner dielectric layer is removed until a top of the first sacrificial patterns is exposed. The first sacrificial patterns and the pad oxide layer are removed. A plurality of openings are formed to expose the substrate at a portion in which the plurality of floating gates are to be formed. A tunneling dielectric layer is formed on a surface of the substrate exposed in the openings, and a polysilicon is filled in the openings. The polysilicon is planarized to form the plurality of floating gates on the tunneling dielectric layer. Then, a hard mask layer is formed on the first inner dielectric layer and the floating gates, and a second sacrificial material is formed on the hard mask layer. A portion of the second sacrificial material is etched and removed to form a plurality of second sacrificial patterns at a portion in which a plurality of control gates are to be formed, and then a second inner dielectric layer is deposited on the substrate and the second sacrificial patterns are covered. A portion of the second inner dielectric layer is removed until a top of the second sacrificial patterns is exposed. The second sacrificial patterns and the hard mask layer are removed to form a plurality of trenches in the second inner dielectric layer and expose a surface of the floating gates. Then, an ONO layer is conformally deposited on the surface of the floating gates, an inner surface of the trenches, and a surface of the second inner dielectric layer, and a conductive material is filled in the trenches, and then the conductive material is planarized to form a plurality of control gates in the trenches.

Based on the above, the process adopted by the invention completely avoids the use of reactive-ion etching (R.I.E.) during gate formation to reduce charge trap caused by high-density plasma damage to the gates, and the reliability of data storage may be improved. In addition, if metal gates are used as control gates in the invention to control the floating gates, a low-power device may be better formed.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a cross-sectional view of a semiconductor device according to yet another embodiment of the invention.

DESCRIPTION OF THE EMBODIMENTS

Figure 1:
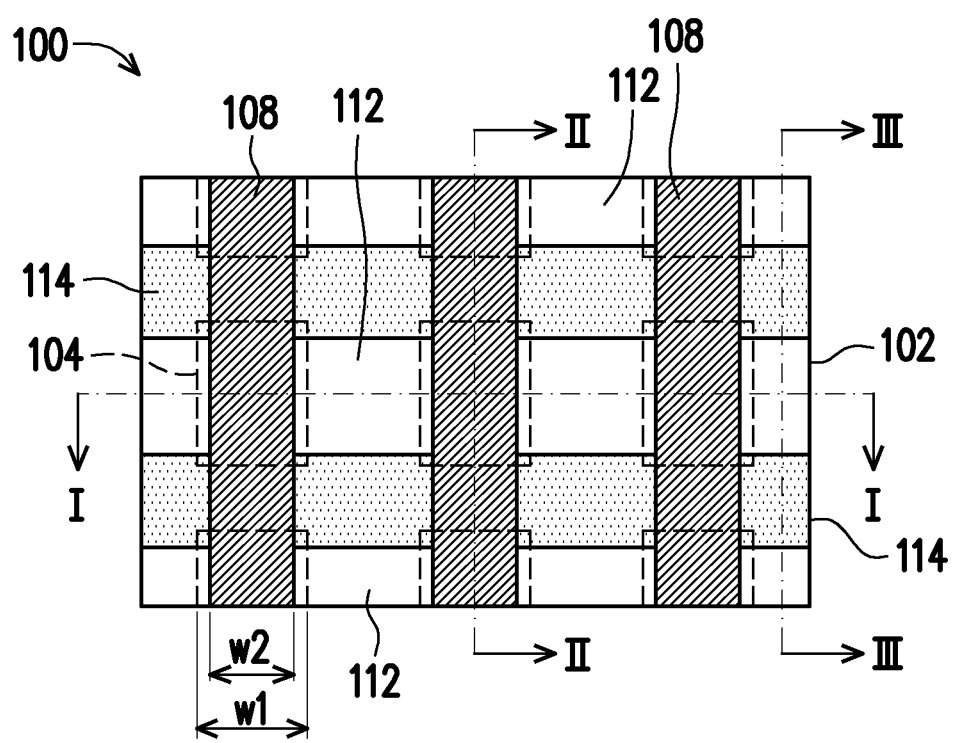
FIG. 1 is a top view of a semiconductor device according to an embodiment of the invention.

The figures in the following embodiments are intended to more comprehensively describe the exemplary embodiments of the inventive concept, but the invention may still be implemented in many different forms, and the invention should not be construed as limited to the recited embodiments. In the figures, for clarity, the relative thickness and location of film layers, regions, and/or structural devices may be reduced or enlarged. Moreover, the same or similar reference numerals represent the same or similar devices and are not repeated in the following paragraphs.

Figure 2A:
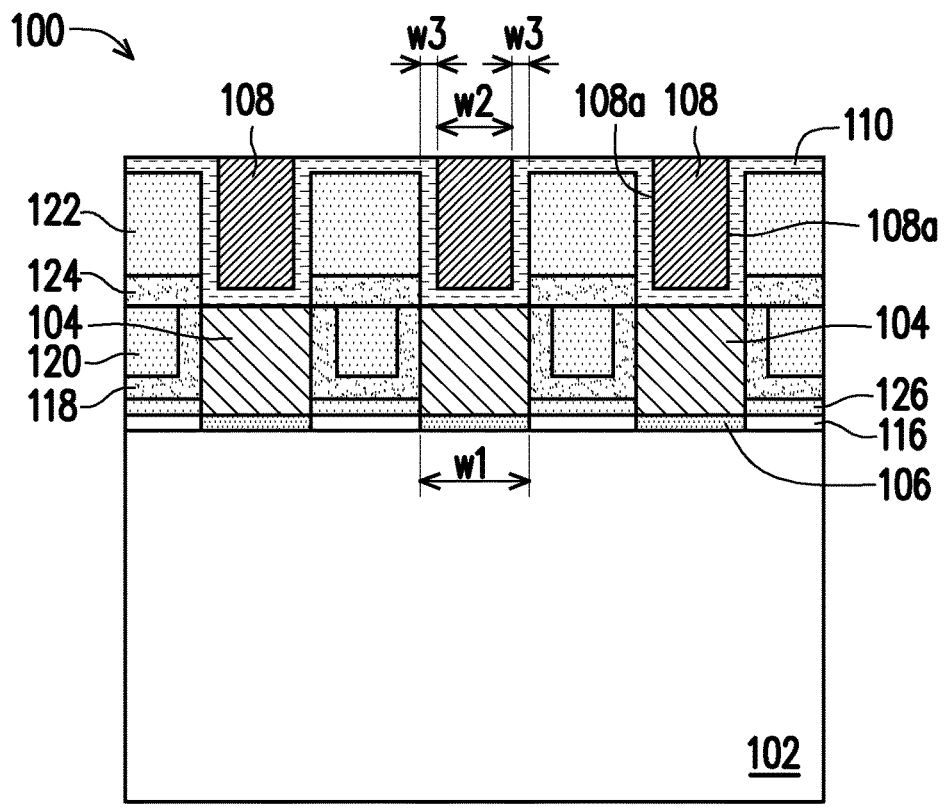
FIG. 2A is a cross-sectional view of the semiconductor device of FIG. 1 at section line I-I.
Figure 2B:
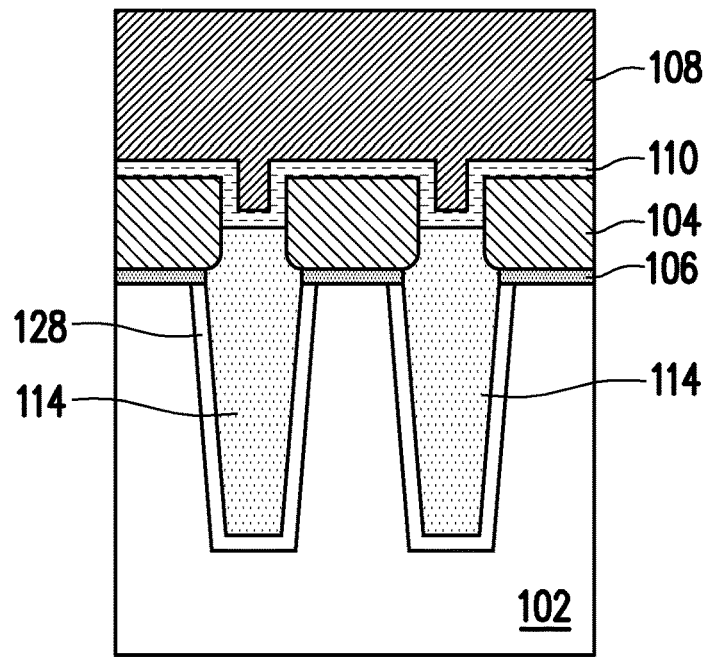
FIG. 2B is a cross-sectional view of the semiconductor device of FIG. 1 at section line II-II.
Figure 2C:
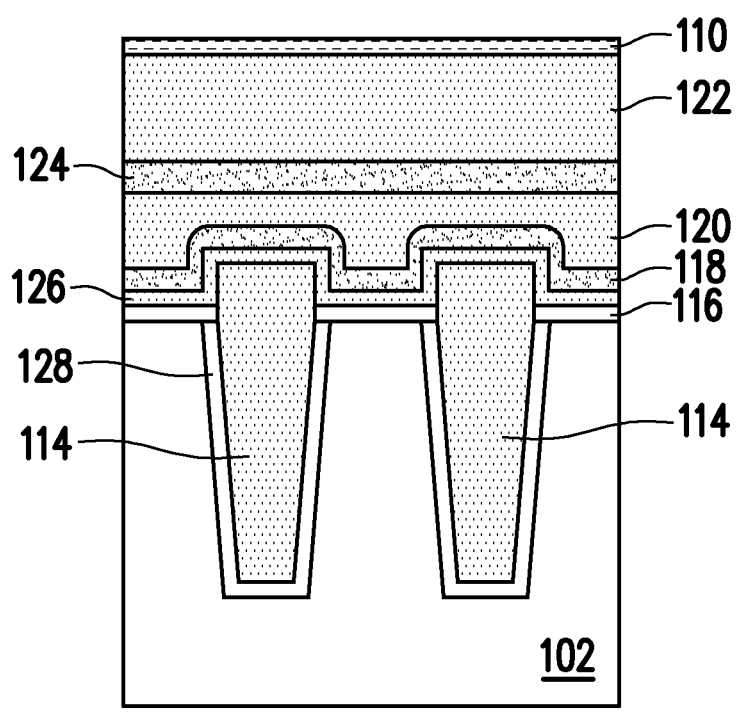
FIG. 2C is a cross-sectional view of the semiconductor device of FIG. 1 at section line III-III.

FIG. 1 is a top view of a semiconductor device according to an embodiment of the invention. FIG. 2A, FIG. 2B, and FIG. 2C are cross-sectional views of the semiconductor device at section line I-I, section line II-II, and section line of FIG. 1, respectively.

Referring to FIG. 1 and FIG. 2A to FIG. 2C, a semiconductor device 100 in the present embodiment includes a substrate 102, a plurality of floating gates 104, a tunneling dielectric layer 106, a plurality of control gates 108, and an ONO layer 110. In FIG. 1, some devices are omitted for clarity, and the floating gates 104, the control gates 108, and isolation structures 114 for defining active regions 112 are shown. The floating gates 104 are located on the substrate 102, and the tunneling dielectric layer 106 is located between the substrate 100 and each of the floating gates 104, and a pad oxide layer 116 or other film layers may be formed on the substrate 102 outside the tunneling dielectric layer 106. In addition, there is a silicon nitride layer 118 having a U-shaped cross section between adjacent floating gates 104. The control gates 108 are located on the floating gates 104, and the ONO layer 110 is located on two sidewalls 108a of each of the control gates 108 and between each of the control gates 108 and each of the floating gates 104.

Both the formation of the floating gates 104 and the formation of the control gates 108 may include first depositing and etching sacrificial patterns (not shown) having the same structure at a portion in which the floating gates 104 and the control gates 108 are to be formed, then forming material layers such as the U-shaped silicon nitride layer 118 and inner dielectric layers 120 and 122, then removing the sacrificial patterns to leave a space, and then forming the floating gates 104 and the control gates 108 in the space. Therefore, the floating gates 104 and the control gates 108 do not need to be defined via high-density plasma reactive-ion etching (R.I.E.), thereby avoiding plasma damage caused by high-density plasma to improve device reliability. In addition, since the control gates 108 do not need to be defined via plasma etching, metal gates may be directly formed to control the floating gates, thus facilitating forming a low-power device. However, the invention is not limited thereto, and the control gates 108 may be polysilicon gates. In the present embodiment, a width w1 of each of the floating gates 104 is greater than a width w2 of each of the control gates 108. Moreover, due to the manufacturing process, the width w1 of each of the floating gates 104 is substantially equal to the sum of the width w2 of each of the control gates 108 and a width w3 of the ONO layer 110 located on the two sidewalls 108a of each of the control gates 108 (w1=w2+2×w3).

In addition, in the semiconductor device 100, for the adhesion of the front and rear layers or process requirements, a hard mask layer 124 may be disposed between the inner dielectric layers 120 and 122, another oxide layer 126 may be disposed between the pad oxide layer 116 and the silicon nitride layer 118, and a liner oxide layer 128 may be formed between the isolation structures 114 and the substrate 102. However, the invention is not limited thereto, and the film layers may also be omitted or replaced with other materials due to design changes.

Hereinafter, a manufacturing method of a semiconductor device of the invention is described in detail, but the invention is not limited thereto. Some steps in the following embodiments may be omitted, or other steps may be added according to requirements.

FIG. 3A to FIG. 3Z are cross-sectional views of a manufacturing process of a semiconductor device according to another embodiment of the invention, wherein part (1) of each figure is compared to the cross section of section line I-I of FIG. 1 (i.e., a unit region 300) and includes a peripheral circuit region 302 not shown in FIG. 1; part (2) is compared to the cross section of section line II-II of FIG. 1; and part (3) is compared to the cross section of section line of FIG. 1. In addition, in FIG. 3A to FIG. 3Z, the same reference numerals as the previous embodiment are used to represent the same or similar devices, and a portion of the technical descriptions omitted, such as the position, size, and materials of each layer or region is provided in the previous embodiment and is therefore not repeated herein.

Referring first to FIG. 3A, the pad oxide layer 116 is deposited on the substrate 102. In order to define active regions (not shown) and form sacrificial patterns (not shown), a silicon nitride layer may be first deposited on the pad oxide layer 116 and patterned to obtain a patterned silicon nitride layer 304.

Then, referring to FIG. 3B, the patterned silicon nitride layer 304 is used as an etch mask, and the pad oxide layer 116 and the substrate 102 are etched to form a plurality of isolation trenches 306 in the substrate 102 and define the plurality of active regions 112. Moreover, due to the etch selectivity between the patterned silicon nitride layer 304, the pad oxide layer 116, and the substrate 102, the surfaces of the pad oxide layer 116 and the substrate 102 may have rounded corners, and a side surface 310 at the junction of the patterned silicon nitride layer 304 and the pad oxide layer 116 is slightly retracted.

Next, referring to FIG. 3C, the liner oxide layer 128 may be formed in the isolation trenches 306 first, then the isolation structures 114 are formed and the patterned silicon nitride layer 304 is exposed. In an embodiment, the isolation structures 114 are formed by, for example, first filling a spin-on glass (SOG) in the isolation trenches 306 to facilitate trench filling, and then, after the SOG is cured, depositing high-density plasma (HDP) oxide on the cured SOG.

Next, referring to FIG. 3D, after the patterned silicon nitride layer 304 of FIG. 3C is cured, a plurality of sacrificial trenches 308 are formed. Then, a first sacrificial material 312 is filled in the sacrificial trenches 308 and the isolation structures 114 are exposed, and a portion of the isolation structures 114 is removed to expose a sidewall of the first sacrificial material 312.

Then, referring to FIG. 3E, a portion of the first sacrificial material is etched and removed to form a plurality of first sacrificial patterns 312a at a portion in which a plurality of floating gates (not shown) are to be formed. At least one first sacrificial pattern 312a is formed on the inside of the peripheral circuit region 302, and due to different functions, the first sacrificial pattern 312a in the peripheral circuit region 302 is greater (or wider). The above is an example of forming the first sacrificial pattern 312a, but the invention is not limited thereto. The first sacrificial pattern 312a may also not be related to the formation of the isolation structures 114, but after the isolation structures 114 are formed, a first sacrificial material is additionally formed and etched to define a plurality of first sacrificial patterns 312a.

Figure 3F:
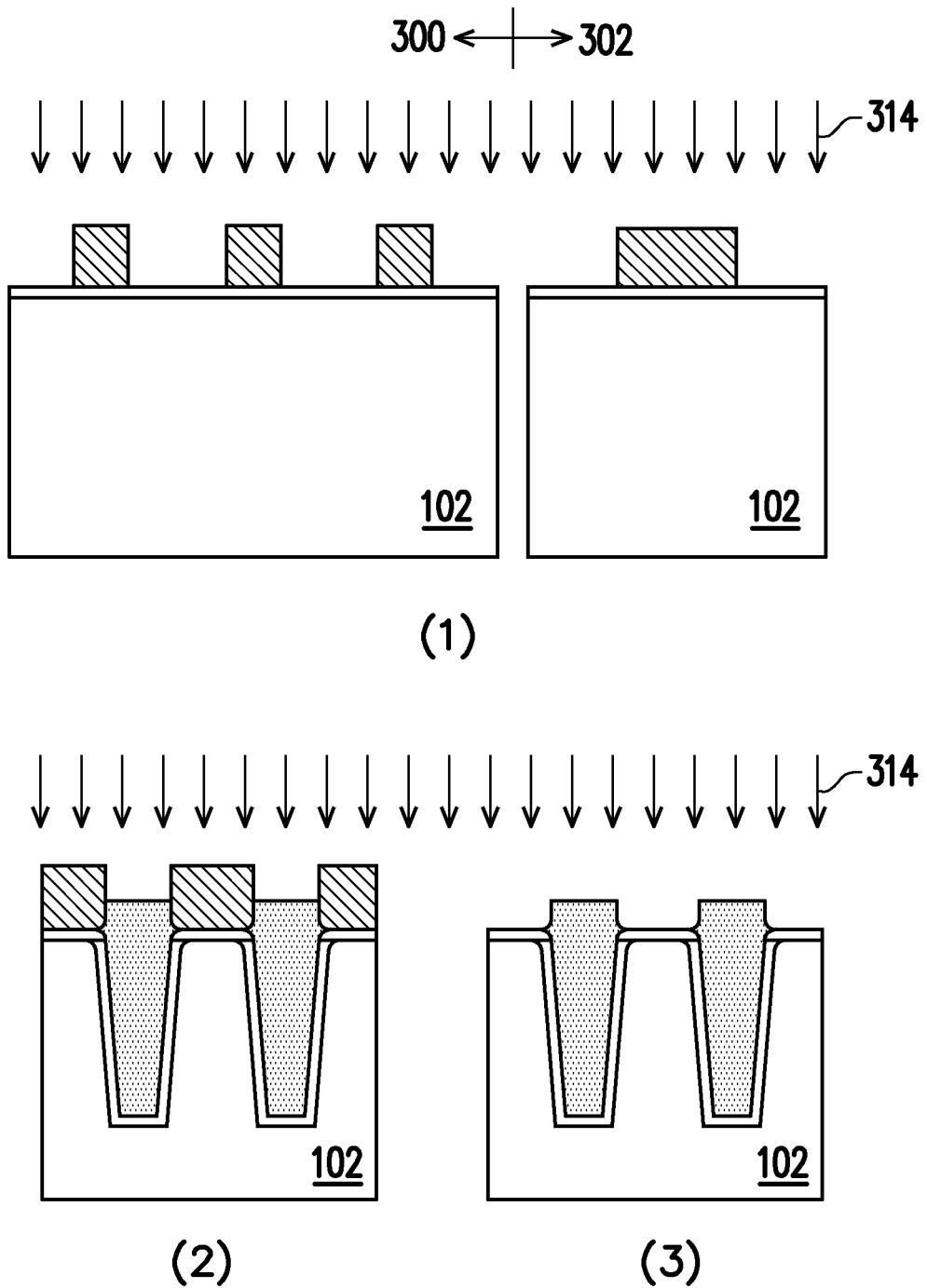
FIG. 3A to FIG. 3Z are cross-sectional views of a manufacturing process of a semiconductor device according to another embodiment of the invention.

Next, referring to FIG. 3F, a low-doped drain (LDD) implantation 314 may be performed to form an LDD region (not shown) in the substrate 102 (the unit region 300 and the peripheral circuit region 302).

Then, referring to FIG. 3G, the oxide layer 126 is deposited on the substrate 102 to completely cover the first sacrificial patterns 312a.

Next, referring to FIG. 3H, spacers 318 are formed on the sidewalls of the first sacrificial patterns 312a, and a source and drain (S/D) implantation 320 is performed to form an S/D region (not shown) in the substrate 102. Since the S/D regions needed by the unit region 300 and the peripheral circuit region 302 are different, the substrate 102 of the peripheral circuit region 302 is protected by a protective layer 322, wherein the protective layer 322 is, for example, a photoresist.

Figure 3I:
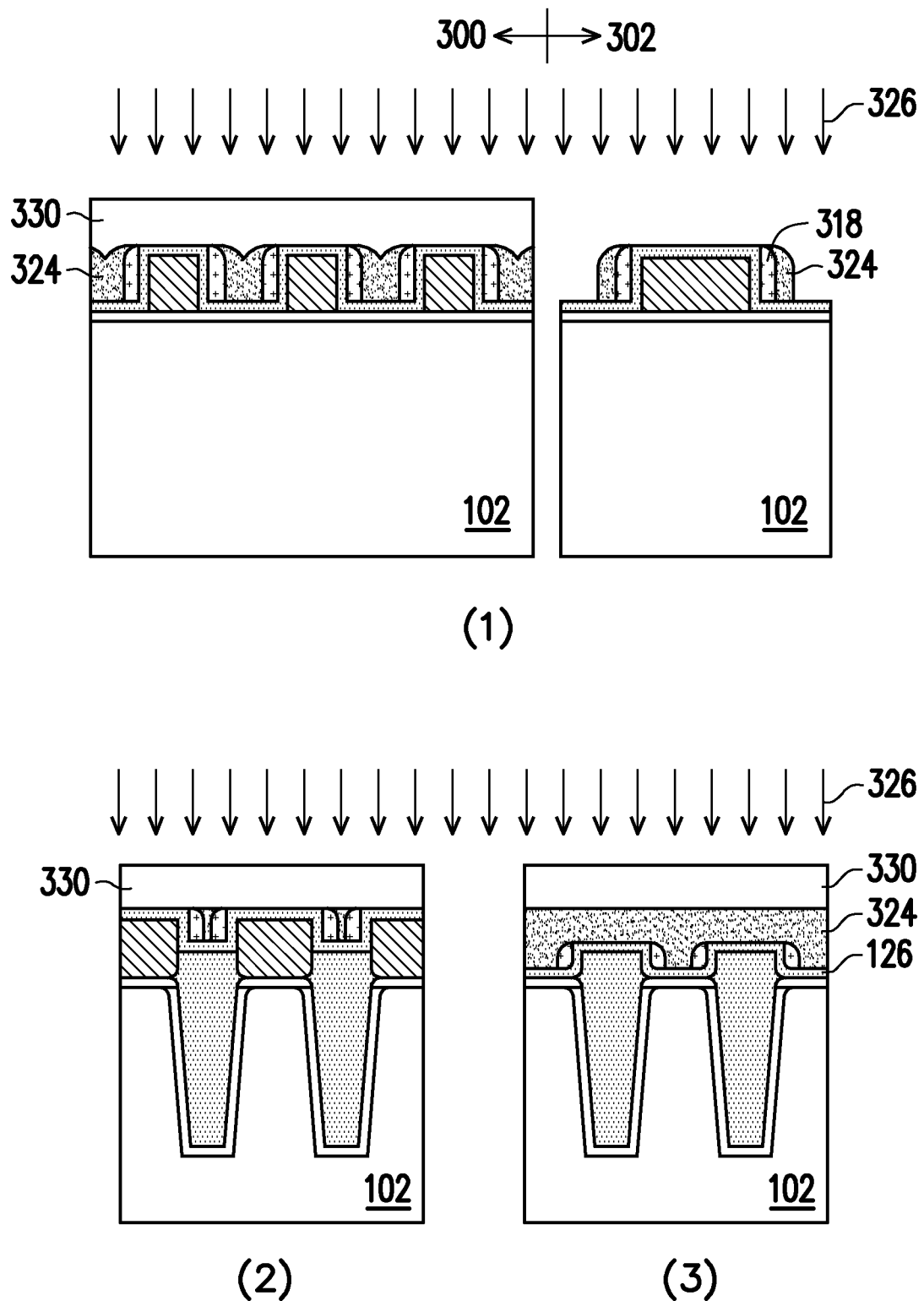

Next, referring to FIG. 3I, after the protective layer 322 of FIG. 3H is removed, another spacer 324 is formed on the outside of the spacers 318, and another source and drain (S/D) implantation 326 is performed to form an S/D region (not shown) in the peripheral circuit region 302, and since the energy of the S/D implantation 326 may be greater, another protective layer 330 may be used to protect the substrate 102 of the unit region 300, wherein the protective layer 330 is, for example, a photoresist.

Then, referring to FIG. 3J, the protective layer 330 and the spacers 318 and 324 in FIG. 3H are removed, leaving only the oxide layer 126. The above steps related to LDD implantation and S/D implantation are optional, and are therefore not limited to be performed at this stage, and may also be performed before the isolation structures 114 are formed.

Figure 3K:
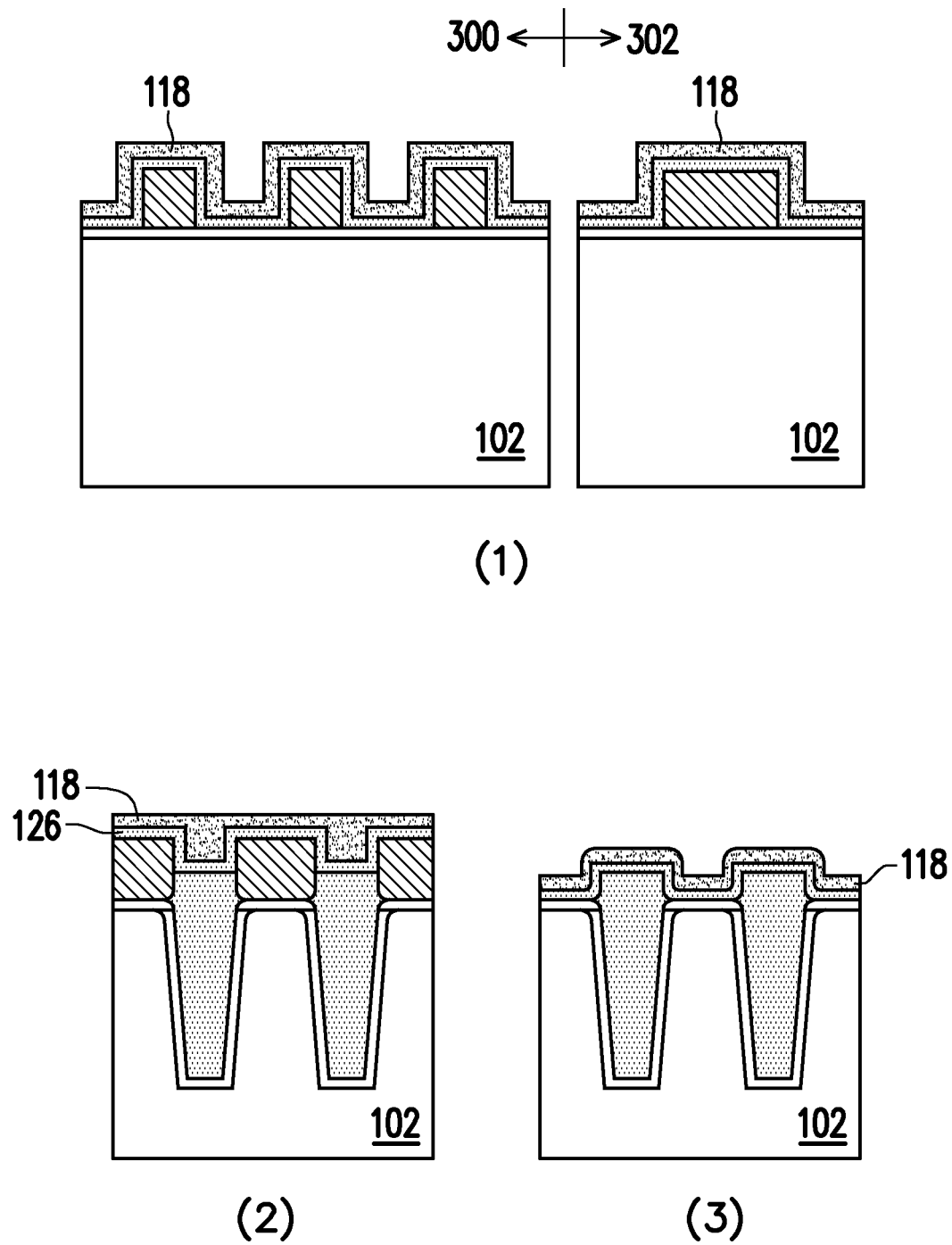

Subsequently, referring to FIG. 3K, the silicon nitride layer 118 is conformally deposited on the substrate 102 and the first sacrificial patterns 312a are covered.

Next, referring to FIG. 3L, the inner dielectric layer 120 is deposited on the substrate 102 and the first sacrificial patterns 312a are covered, and then a portion of the inner dielectric layer 120 is removed until the top of the silicon nitride layer 118 is exposed, wherein a method of removing a portion of the inner dielectric layer 120 is, for example, chemical-mechanical polishing (CMP).

Then, referring to FIG. 3M, the silicon nitride layer 118 exposed in FIG. 3L is removed first until the oxide layer 126 underneath is exposed, and then the peripheral circuit region 302 is covered via a protective layer 332, and the exposed oxide layer 126 is removed until the first sacrificial patterns 312a in the unit region 300 are exposed, wherein the protective layer 332 is, for example, a photoresist.

Then, referring to FIG. 3N, the first sacrificial patterns 312 a and the pad oxide layer 116 underneath are removed to form a plurality of openings 334 exposing the substrate 102 at a portion in which a plurality of floating gates are to be formed. Next, the protective layer 332 of FIG. 3M is removed.

Then, referring to FIG. 3O, the tunneling dielectric layer 106 is formed on the surface of the substrate 102 exposed in the openings 334, and then a polysilicon 336 is filled in the openings 334.

Next, referring to FIG. 3P, the polysilicon is planarized to form the plurality of floating gates 104 on the tunneling dielectric layer 106. At this time, the first sacrificial patterns 312a still remain in the peripheral circuit region 302, but the invention is not limited thereto. If the material of the first sacrificial patterns 312a is not a conductive material such as polysilicon, then the protective layer 332 may be omitted in the step of FIG. 3M, so that the first sacrificial patterns 312a in the peripheral circuit region 302 and the pad oxide layer 116 underneath are removed together in the step of FIG. 3N and replaced with the floating gates 104 together in FIG. 3P.

Next, referring to FIG. 3Q, the hard mask layer 124 is formed on the inner dielectric layer 120 and the floating gates 104, and a second sacrificial material 338 is formed on the hard mask layer 124.

Then, referring to FIG. 3R, a portion of the second sacrificial material 338 is etched and removed to form a plurality of second sacrificial patterns 338a at a portion in which a plurality of control gates are to be formed.

Next, referring to FIG. 3S, the inner dielectric layer 122 is deposited on the substrate 102 and the second sacrificial patterns 338a are covered, and then a portion of the inner dielectric layer 122 is removed until the top of the second sacrificial patterns 338a is exposed, wherein a method of removing the portion of the inner dielectric layer 122 is, for example, chemical-mechanical polishing (CMP).

Then, referring to FIG. 3T, the second sacrificial patterns 338a are removed, and a plurality of smaller trenches 340 are formed in the inner dielectric layer 122, and a portion of the hard mask layer 124 is exposed.

Next, referring to FIG. 3U, the exposed hard mask layer 124 is removed, so that slightly larger trenches 340a are formed in the inner dielectric layer 122 and the surface of the floating gates 104 is exposed. Since part (2) is compared to section line II-II of FIG. 1, only one trench 340a is shown here.

Then, referring to FIG. 3V, the ONO layer 110 is conformally deposited on the surface of the floating gates 104, the inner surface of the trenches 340a, and the surface of the inner dielectric layer 122.

Next, referring to FIG. 3W, the unit region 300 is covered by a protective layer 342 and exposed above the first sacrificial patterns 312a of the peripheral circuit region 302, wherein the protective layer 342 is, for example, a photoresist. Subsequently, the ONO layer 110 and the oxide layer 126 on the first sacrificial patterns 312a are removed by etching, and the surface of the first sacrificial patterns 312a is exposed.

Next, referring to FIG. 3X, the protective layer 342 in FIG. 3W is removed and a conductive material is filled in the trenches 340a, and then the conductive material is planarized to form the plurality of control gates 108 in the trenches 340a, wherein the conductive material may be metal or polysilicon. At this step, self-aligned floating gates 104 and control gates 108 are completed. Since the formation of the floating gates 104 and the control gates 108 does not require the use of high-density plasma (HDP) reactive-ion etching (R.I.E.), the quality thereof and device reliability may be improved. In addition, the control gates 108 may directly form metal gates to control the floating gates 104 to facilitate forming a low-power consumption device. The control gates 108 of the peripheral circuit region 302 are in direct contact with the first sacrificial patterns 312a, and the ONO layer 110 of the peripheral circuit region 302 is located on two sidewalls of the control gates 108.

Next, in order to form a contact, please refer to FIG. 3Y and FIG. 3Z. In FIG. 3Y, an inner dielectric layer 344 is deposited on the substrate 102 and the control gates 108 are covered. In FIG. 3Z, a portion of the inner dielectric layer 344, a portion of the ONO layer 110, a portion of the inner dielectric layer 122, a portion of the hard mask layer 124, a portion of the inner dielectric layer 120, and a portion of the pad oxide layer 116 are removed via etching to form contact holes 346 between the floating gates 104. In addition, due to the relationship of the etch selectivity, a groove 348 may further be formed on the top of the control gates 108 of the peripheral circuit region 302 during the process of forming the contact holes 346.

If the protective layer 332 is omitted in the step of FIG. 3M, the first sacrificial patterns 312a in the peripheral circuit region 302 and the pad oxide layer 116 underneath would be removed together in the step of FIG. 3N and replaced with the floating gates 104 together in FIG. 3P. Therefore, after performing the same steps as FIGS. 3A-3Z without the protective layer 332, the resulting semiconductor device is as shown in FIG. 4, wherein the control gate 108 of the peripheral circuit region 302 is located on the floating gate 104 and in direct contact with the floating gate 104.

Based on the above, in the invention, reactive-ion etching (R.I.E.) is not used at all during the formation of the floating gates and the control gates, and therefore damage to the gates from high-density plasma may be prevented, such as charge trap in the floating gates may be significantly reduced to improve the reliability of data storage. In addition, since the control gates of the invention are formed by using deposition and planarization, metal may be directly used as the control gates to control the floating gates to facilitate the formation of a low-power consumption device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
    a substrate;
    a plurality of floating gates located on the substrate;
    a tunneling dielectric layer located between the substrate and each of the floating gates;
    a plurality of control gates located on the plurality of floating gates, wherein a width of each of the floating gates is greater than a width of each of the control gates;
    an ONO layer located on two sidewalls of each of the control gates and between each of the control gates and each of the floating gates, and the ONO layer is a continuous film on the two sidewalls of the control gate and between the control gate and the floating gate; and
    the substrate further comprises a peripheral circuit region, wherein the peripheral circuit region comprises:
    at least one of the control gates located on the substrate; and
    the ONO layer located on the two sidewalls of each of the control gates.

2. The semiconductor device of claim 1, wherein the control gates are metal gates or polysilicon gates.

3. The semiconductor device of claim 1, wherein a width of each of the floating gates is equal to a sum of a width of each of the control gates and a width of the ONO layer located on the two sidewalls of each of the control gates.

4. The semiconductor device of claim 1, wherein a top of the control gate of the peripheral circuit region has a groove.

5. The semiconductor device of claim 1, further comprising a pad oxide layer located on the substrate outside the tunneling dielectric layer.

6. The semiconductor device of claim 1, further comprising a silicon nitride layer having a U-shaped cross section located between adjacent floating gates.

* * * * *